(12) United States Patent
Cha et al.

(10) Patent No.: US 11,635,697 B2
(45) Date of Patent: Apr. 25, 2023

(54) SEMICONDUCTOR DEVICE MANUFACTURING SYSTEM

(71) Applicant: SAMSUNG ELECTRONICS CO., LTD., Suwon-si (KR)

(72) Inventors: Soon Hwan Cha, Seoul (KR); Chan Hwang, Seoul (KR); Woo Jin Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/234,908

(22) Filed: Apr. 20, 2021

(65) Prior Publication Data

US 2022/0066328 A1 Mar. 3, 2022

(30) Foreign Application Priority Data

Aug. 25, 2020 (KR) .................. 10-2020-0106745

(51) Int. Cl.
*G03F 7/20* (2006.01)

(52) U.S. Cl.
CPC ........ *G03F 7/70466* (2013.01); *G03F 7/7065* (2013.01); *G03F 7/70508* (2013.01); *G03F 7/70525* (2013.01); *G03F 7/70633* (2013.01)

(58) Field of Classification Search
CPC ............ G03F 7/70466; G03F 7/70508; G03F 7/70525; G03F 7/70633; G03F 7/7065
See application file for complete search history.

(56) References Cited

U.S. PATENT DOCUMENTS

| | | | |
|---|---|---|---|
| 7,003,758 B2 * | 2/2006 | Ye ...................... | G06T 7/0004 716/52 |
| 7,449,265 B1 * | 11/2008 | Dixon ................. | G03F 7/70625 257/797 |
| 7,853,920 B2 * | 12/2010 | Preil ..................... | G03F 7/7065 716/52 |
| 8,455,982 B2 | 6/2013 | Chen et al. | |

(Continued)

FOREIGN PATENT DOCUMENTS

KR 10-2016-0032596 3/2016

*Primary Examiner* — Steven Whitesell Gordon
(74) *Attorney, Agent, or Firm* — F. Chau & Associates, LLC

(57) ABSTRACT

A semiconductor device manufacturing system includes a photolithography apparatus that performs exposure. On a semiconductor substrate including a chip area and a scribe lane area. An etching apparatus etches the exposed semiconductor substrate. An observing apparatus images the etched semiconductor substrate. A controller controls the photolithography apparatus and the etching apparatus. The controller generates a first mask pattern and provides the first mask pattern to the photolithography apparatus. The photolithography apparatus performs exposure on the semiconductor substrate using the first mask pattern. The etching apparatus performs etching on the exposed semiconductor substrate to provide an etched semiconductor substrate. The observing apparatus generates a first semiconductor substrate image by imaging the etched semiconductor substrate corresponding to the scribe lane area. The controller generates a second mask pattern based on the first mask pattern and the first semiconductor substrate image, and provides the second mask pattern to the photolithography apparatus.

18 Claims, 34 Drawing Sheets

(56) References Cited

U.S. PATENT DOCUMENTS

| | | | |
|---|---|---|---|
| 8,863,043 B1* | 10/2014 | Usui | G03F 1/84 |
| | | | 716/52 |
| 9,633,915 B1 | 4/2017 | Park et al. | |
| 9,811,003 B2 | 11/2017 | Jak et al. | |
| 10,083,914 B2 | 9/2018 | Huang | |
| 2003/0016339 A1* | 1/2003 | Taniguchi | G03B 27/72 |
| | | | 355/69 |
| 2008/0182415 A1 | 7/2008 | Hong et al. | |
| 2019/0155174 A1* | 5/2019 | Kim | H01L 23/544 |

\* cited by examiner

SEMICONDUCTOR DEVICE MANUFACTURING SYSTEM

CROSS-REFERENCE TO RELATED APPLICATION

This application claims priority under 35 U.S.C. § 119 to Korean Patent Application No. 10-2020-0106745, filed on Aug. 25, 2020 in the Korean Intellectual Property Office, the disclosure of which is incorporated by reference in its entirety herein.

TECHNICAL FIELD

The present inventive concepts relate to a semiconductor device manufacturing system.

DISCUSSION OF RELATED ART

As semiconductor devices become more highly integrated, the line width of the pattern in the semiconductor devices may become increasingly fine. Therefore, a self-aligned double patterning (SADP) process or the like has been developed to form a line pattern in manufacturing a semiconductor device. The SADP process is a process of performing double patterning to form a mask pattern having a line width that is narrower than the width of a mask pattern formed by an exposure process and then forming a fine pattern using the mask pattern.

When performing the SADP process, there in be a difference in thicknesses of materials formed on a chip area and a scribe lane area of a semiconductor device. Therefore, a portion of the pattern on the scribe lane area may not be formed. Accordingly, there is a demand for a semiconductor device manufacturing method that forms patterns on both a chip area and a scribe lane area.

SUMMARY

Aspects of the present inventive concepts provide a semiconductor device manufacturing system having increased reliability.

Aspects of the present inventive concepts also provide a semiconductor device manufacturing system that may form patterns on both a chip area and a scribe lane area of a semiconductor device.

Aspects of the present inventive concepts also provide a semiconductor device manufacturing system that may form patterns on both a specific region of a semiconductor device and another region different from the specific region.

However aspects of the present inventive concepts are not restricted to those set forth herein. The above and other aspects of the present inventive concepts will become more apparent to one of ordinary skill in the art to which the present inventive concepts pertain by referencing the detailed description of embodiments given below.

Specific details of some other embodiments are included in the detailed description and drawings.

According to an embodiment of the present inventive concepts, a semiconductor device manufacturing system includes a photolithography apparatus configured to perform exposure oi a semiconductor substrate including a chins area and a scribe lane area. An etching apparatus is configured to etch the semiconductor substrate that has been exposed by the photolithography apparatus. An observing apparatus is configured to image the semiconductor substrate that has been etched by the etching apparatus. A controller is configured to control the photolithography apparatus and the etching apparatus. The controller generates a first mask pattern and provides the first mask pattern to the photolithography apparatus. The photolithography apparatus performs exposure on the semiconductor substrate using the first mask pattern to provide an exposed semiconductor substrate. The etching apparatus performs etching on the exposed semiconductor substrate to provide an etched semiconductor substrate. The observing apparatus generates a first semiconductor substrate image by imaging the etched semiconductor substrate corresponding to the scribe lane area. The controller generates a second mask pattern based on the first mask pattern and the first semiconductor substrate image, and provides the second mask pattern to the photolithography apparatus.

According to an embodiment of the present inventive concepts, a semiconductor device manufacturing system includes a photolithography apparatus configured to perform exposure on a semiconductor substrate including a first region and a second region. An etching apparatus is configured to etch the semiconductor substrate that has been exposed by the photolithography apparatus. A controller is configured to control the photolithography apparatus and the etching apparatus. The controller generates a first mask pattern for the first region and a second mask pattern for the second region and provides the first and second mask patterns to the photolithography apparatus. An arrangement density of the second mask pattern is less than an arrangement density of the first mask pattern. The photolithography apparatus performs exposure on the first and second regions of the semiconductor substrate using the first and second mask patterns, respectively, to provide an exposed semiconductor substrate. The etching apparatus performs etching on the exposed semiconductor substrate. The controller generates a third mask pattern based on the second mask pattern and an image of the second region of the semiconductor substrate that has been etched by the etching apparatus, and provides the third mask pattern to the photolithography apparatus.

According to an embodiment of the present inventive concepts, a semiconductor device manufacturing system includes a photolithography apparatus configured to perform exposure on a semiconductor substrate including a chip area and a scribe lane area. An etching apparatus is configured to perform etching on the semiconductor substrate. A deposition apparatus is configured to perform deposition on the substrate. A controller is configured to control the photolithography apparatus and the etching apparatus. The controller generates a first mask pattern and provides the first mask pattern to the photolithography apparatus. The photolithography apparatus and the etching apparatus form a first pattern on the chip area of the substrate using the first mask pattern, and form a second pattern on the scribe lane area of the substrate. The deposition apparatus forms a first spacer layer on the first pattern, forms a second spacer layer on the second pattern, forms a first mask layer on the first spacer laver, and forms a second mask layer on the second spacer layer. The etching apparatus forms a third pattern by etching the first mask layer and the first spacer layer, and forms a fourth pattern by etching the second mask layer and the second spacer layer. The etching apparatus etches the substrate on the scribe lane area using the fourth pattern. The controller generates a second mask pattern based on an image of the substrate etched using the first mask pattern and the fourth pattern, and provides the second mask pattern to the photolithography apparatus.

BRIEF DESCRIPTION OF THE DRAWINGS

The above and other aspects and features of the present inventive concepts will become more apparent by describing in detail embodiments thereof with reference to the attached drawings, in which.

DETAILED DESCRIPTION OF EMBODIMENTS

Hereinafter, embodiments of the present inventive concepts will be described with reference to the accompanying drawings.

Figure 1:
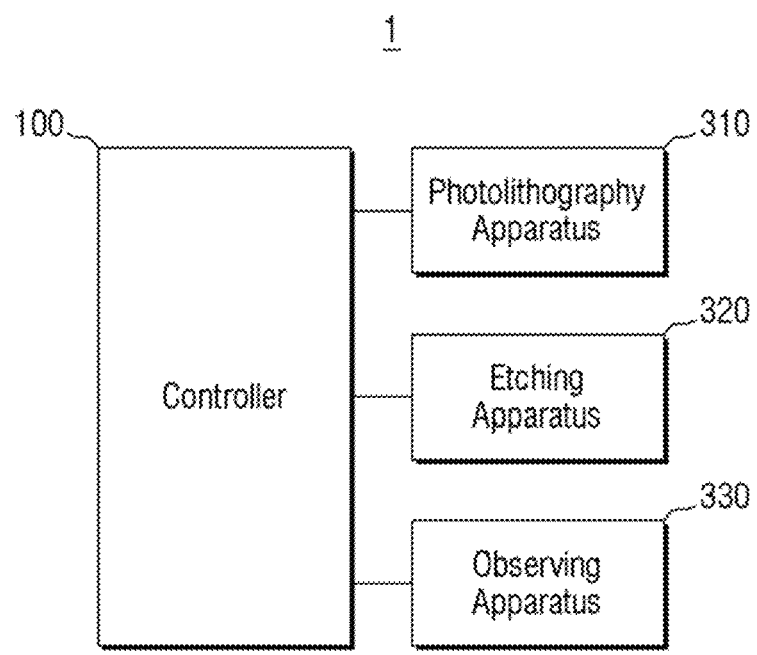
FIG. 1 is a block diagram of a semiconductor device manufacturing system according to an embodiment of the present inventive concepts.
Figure 2:
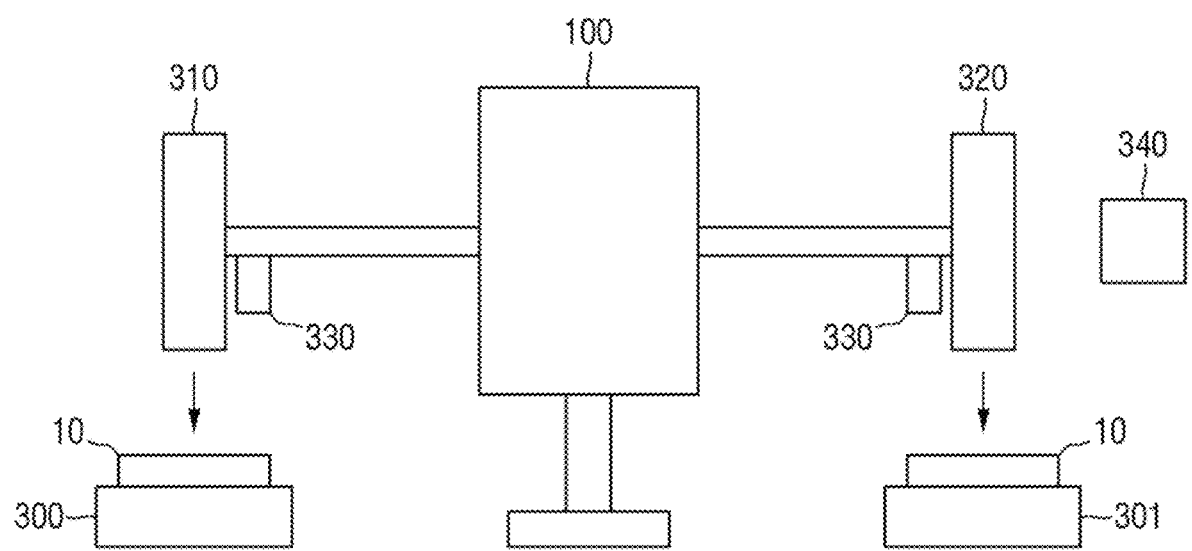
FIG. 2 is a diagram of a semiconductor device manufacturing apparatus according to an embodiment of the present inventive concepts.

FIG. 1 is a block diagram of a semiconductor device manufacturing system according to an embodiment of the present inventive concepts. FIG. 2 is, a diagram for explaining a semiconductor device manufacturing apparatus according to an embodiment of the present inventive concepts.

Referring to the embodiment of FIG. 1, a semiconductor device manufacturing system 1 may include a controller 100, a photolithography apparatus 310, an etching apparatus 320, and an observing apparatus 330.

As shown in the embodiment of FIG. 2, the controller 100 may be connected to the photolithography apparatus 310, the etching apparatus 320, and the observing apparatus 330. For example, the controller 100 may control the photolithography apparatus 310, the etching apparatus 320, the observing apparatus 330, and the like. For example, in an embodiment, the controller 100 may control the exposure process performed by the photolithography apparatus 310 and the etching process performed by the etching apparatus 320.

Referring to the embodiment of FIG. 2, the photolithography apparatus 310 may perform the exposure process on a semiconductor substrate 10 disposed on a first stage 300. The controller 100 may provide a mask or the like to the photolithography apparatus 310, and the photolithography apparatus 310 may perform the exposure process on the semiconductor substrate 10 using the received mask.

The etching apparatus 32 may perform the etching process on the semiconductor substrate 10 disposed on a second stage 301. The controller 100 may control the etching apparatus 320 to perform the etching process on the semiconductor substrate 10. The semiconductor substrate 10 disposed on the second stage 301 may be the same as the semiconductor substrate 10 disposed on the first stage 300. For example, the semiconductor substrate 10 may be transferred onto the second stage 301 ager it is subjected to the exposure process by the photolithography apparatus 310 on the first stage 300. However, embodiments of the present inventive concepts are not limited thereto. For example, in some embodiments, the semiconductor substrate 10 on the second stage 301 may be transferred to the first stage 300 after it is subjected to the etching process by the etching apparatus 320.

The observing apparatus 330 may be disposed near the photolithography apparatus 310 and the etching apparatus 320. For example, in an embodiment, the observing apparatus 330 may image the semiconductor substrate 10 that is being subjected to or has been subjected to the exposure process. The observing apparatus 330 may image the semiconductor substrate 10 that is being subjected to or has been subjected to the etching process. In an embodiment, the image of the semiconductor substrate 10 taken by the observing apparatus 330 may be a scanning electron microscope (SEM) image or an intensity map image. However, embodiments of the present inventive concepts are not limited thereto.

In an embodiment, the semiconductor device manufacturing system 1 may include a deposition apparatus 340. The deposition apparatus 340 may perform a deposition process during the manufacture of the semiconductor device.

Figure 3:
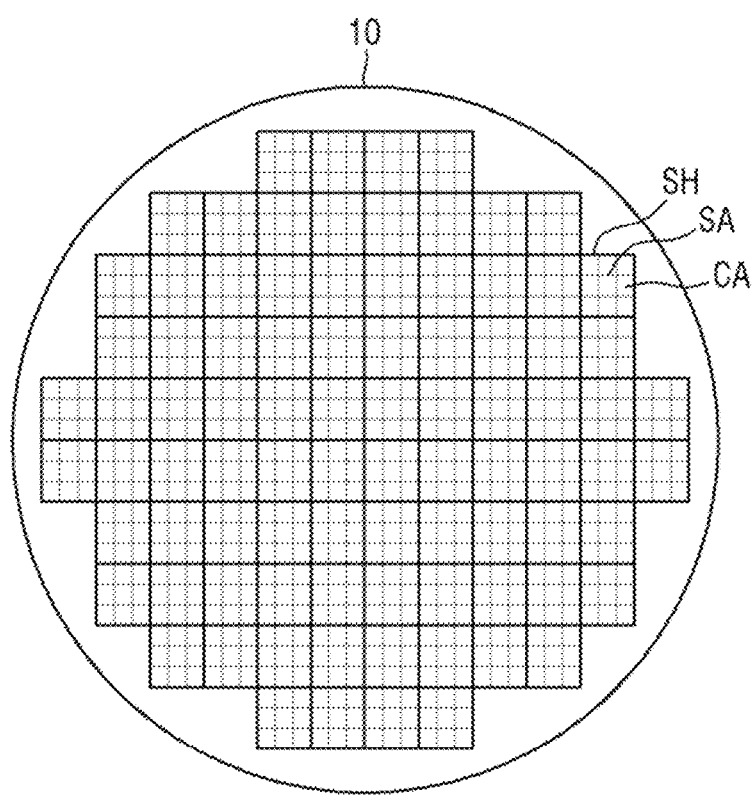
FIG. 3 is a diagram of a semiconductor substrate according to an embodiment of the present inventive concepts.
Figure 4:
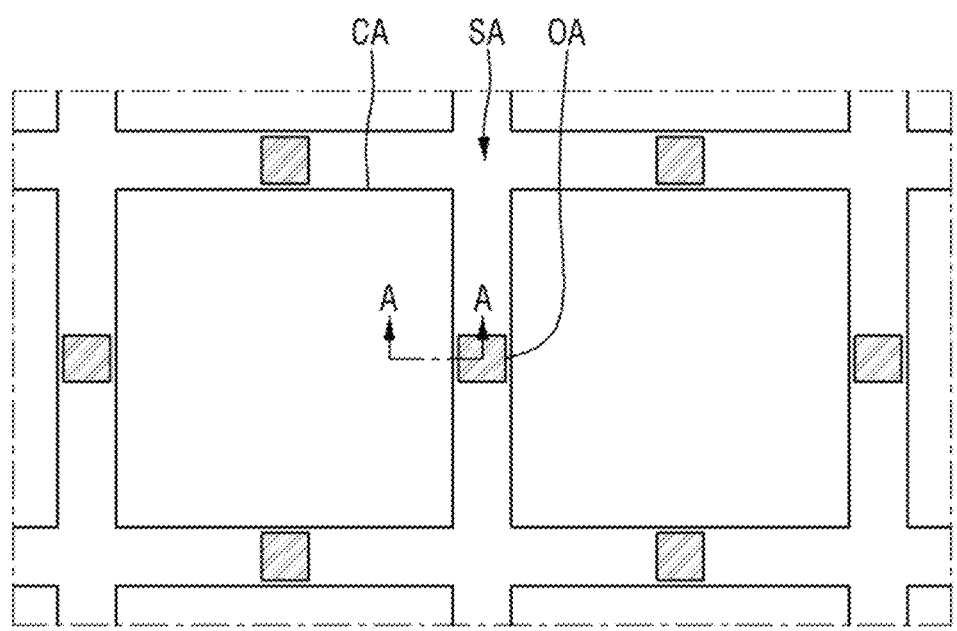
FIG. 4 is a partially enlarged view of the semiconductor substrate of FIG. 3 according to embodiment of the present inventive concepts.
Figure 5:
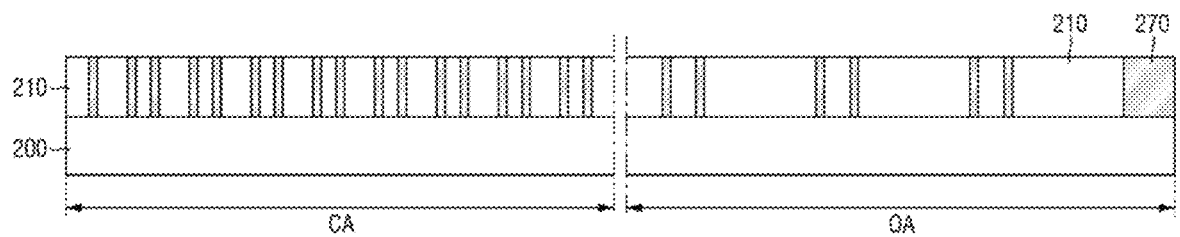
FIG. 5 is a cross-sectional view of the semiconductor substrate taken alone line A-A of FIG. 4 according to an embodiment of the present inventive concepts.
Figure 6:
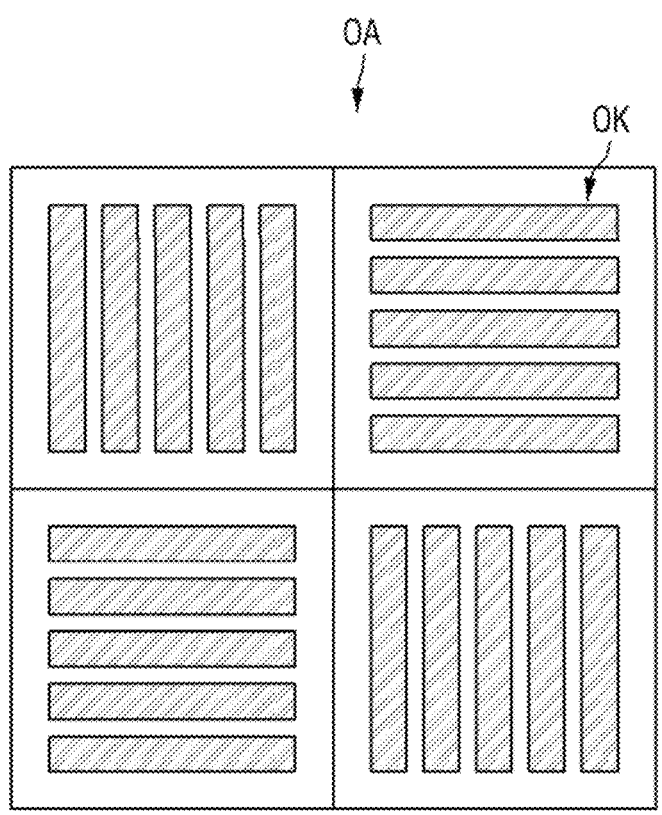
FIG. 6 is an enlarged view of an overlay key area of FIG. 4 according to an embodiment of the present inventive concepts.

FIG. 3 is a diagram describing a semiconductor substrate according to an embodiment of the present inventive concepts. FIG. 4 is a partially enlarged view of the semiconductor substrate of FIG. 3. FIG. 5 is a cross-sectional view of the semiconductor substrate taken along line A-A of FIG. 4. FIG. 6 is an enlarged view of an overlay key area of FIG. 4.

The semiconductor substrate 10 may correspond to the semiconductor substrate 10 disposed on the first stage 300 or the second stage 301 of FIG. 2.

Referring to the embodiments of FIGS. 3 and 4, the semiconductor substrate 10 may include a plurality of shot areas SH. The shot area SH may be an area exposed by a single exposure process. One shot area SH may include one chip area CA or plurality of chip areas CA. For example, as shown in the embodiment of FIG. 3, one shot area SH may include 9 chip areas CA. However, embodiments of the present inventive concepts are not limited thereto. The chip area CA may include a plurality of circuit areas.

A scribe lane area SA may be disposed between plurality of chip areas CA. For example, the chip area CA may be defined by the scribe lane area SA. The scribe lane area SA may surround the chip area CA. For example, as shown in the embodiment of FIG. 3, the scribe lane area SA may completely surround the chip area CA.

In an embodiment, the overlay key area OA may be disposed on the semiconductor substrate 10. For example, as shown in the embodiment of FIG. 4, the overlay key area OA may be disposed on the scribe lane area SA. However, embodiments of the present inventive concepts are not limited thereto. For example, in other embodiments, the overlay key area OA may be disposed on the chip area CA. For convenience of explanation, an embodiment in which the overlay key area OA is disposed on the scribe lane area SA is described herein.

Referring to the embodiment of FIG. 5, the semiconductor substrate 10 may include the chip area CA and the overlay key area OA. The chip area CA and overlay key area OA may be spaced apart from each other. For example, the semiconductor substrate 10 shown in the embodiment of FIG. 5 may be the semiconductor substrate 10 that has been subjected to the exposure process by the photolithography apparatus 310 and the etching process by the etching apparatus 320.

For example, as shown in FIG. 5, a substrate 200, an etching target layer 210, a mask layer 220 (FIG. 8), and a metal layer 270 may be formed on the chip area CA. Further, for example, the substrate 200, the etching target layer 210, the mask layer 220, and the metal layer 270 may be formed on the overlay key area OA. The substrate 200, the etching target layer 210, the mask layer 220, and the metal layer 270 may correspond to the patterns of the semiconductor substrate 10. For example, in an embodiment, the substrate 200, the etching target layer 210, the mask layer 220, and the metal layer 270 on the chip area CA may be chip patterns, and the substrate 200, the etching target layer 210, the mask layer 220, and the metal layer 270 on the overlay key area OA may be overlay key patterns.

Referring to the embodiment of FIG. 6 the overlay key patterns OK may be formed on the overlay key area OA. In the embodiment of FIG. 6, it is illustrated that each of the overlay key patterns OK extends in a horizontal direction or in a vertical direction. However, embodiments of the present inventive concepts are not limited thereto. For example, the overlay key patterns OK may extend only in one specific direction or may have various other arrangements.

The overlay key patterns OK may include the substrate 200, the etching target layer 210, the mask layer 220, and the metal layer 270 on the overlay key area OA. In an embodiment, the overlay key patterns OK may be the metal layer 270 formed on the substrate 200. For example, the overlay key patterns OK may be the metal layer 270 having a fine line width on the substrate 200. However, embodiments of the present inventive concepts are not limited thereto.

In an embodiment, the overlay key patterns OK of the overlay key area OA may be used to align the overlays between plurality of layers of the semiconductor substrate 10 within an error range. For example, the efficiency and accuracy of the semiconductor device manufacturing process may be increased by the overlay key patterns OK formed on the semiconductor substrate 10.

Hereinafter, a method of manufacturing the semiconductor substrate 10 according to embodiments of the present inventive concepts will be described with reference to FIGS. 7 to 17.

Figure 7:
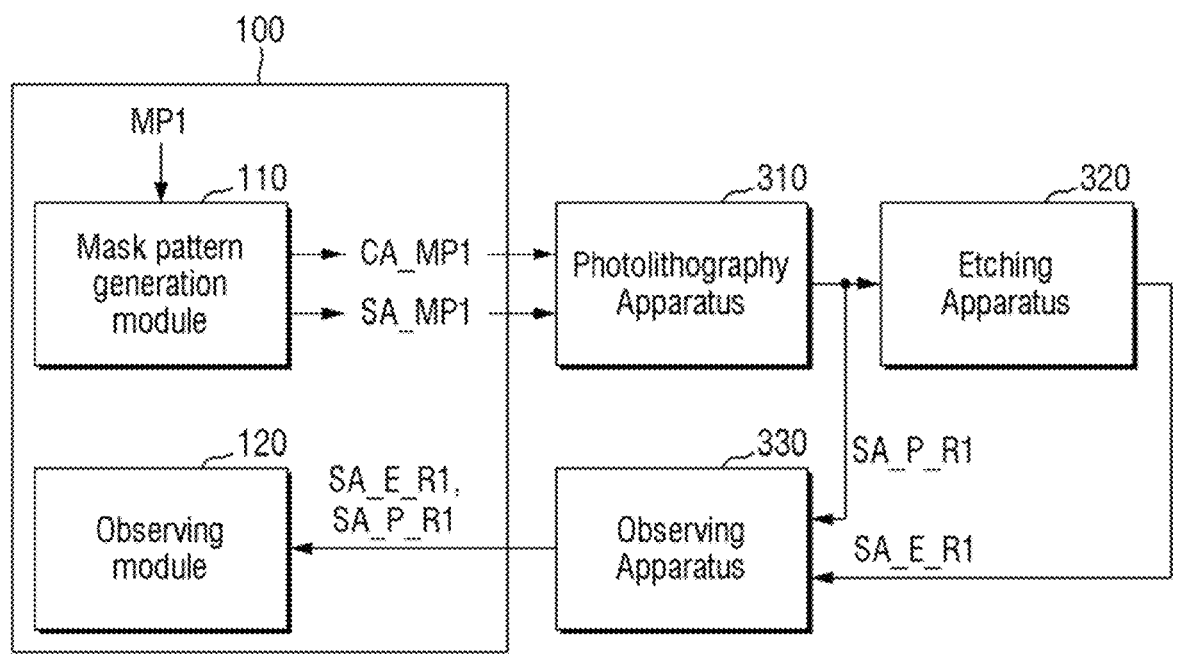
FIG. 7 is a block diagram of a semiconductor device manufacturing system according to an embodiment of the present inventive concepts.

FIG. 7 is a block diagram of a semiconductor device manufacturing system according to an embodiment of the present inventive concepts. FIGS. 8 to 17 are views illustrating the intermediate steps of a method of manufacturing a semiconductor device according to embodiments of the present inventive concepts.

Referring to the embodiment of FIG. 7, a semiconductor device manufacturing system 2 may include a controller 100, a photolithography apparatus 310, an etching apparatus 320, and an observing apparatus 130. The controller 100 may be connected to the photolithography apparatus 310, the etching apparatus 320, and the observing apparatus 330. In an embodiment, the controller 100 may include a mask pattern generation module 110 and an observing module 120.

The mask pattern generation module 110 may receive a first mask pattern MP1 used in the exposure process and generate a first chip area mask pattern CA_MP1 and a first scribe lane area mask pattern SA_MP1. For example, the first mask pattern MP1 may be used as a mask of the exposure process Since the exposure process is performed using the first mask pattern MP1, a photoresist pattern may be formed on the semiconductor substrate 10.

For example, the first mask pattern MP1 may include the first chip area mask pattern CA_MP1 and the first scribe lane area mask pattern SA_MP1. For example, the first chip area mask pattern CA_MP1 may be the first mask pattern MP1 corresponding to the chip area CA of the semiconductor substrate 10. Further, the first scribe lane area mask pattern SA_MP1 may be the first mask pattern MP1 corresponding to the scribe lane area SA of the semiconductor substrate 10. The mask pattern generation module 110 may provide the generated first chip area mask pattern CA_MP1 and the generated first scribe lane area mask pattern SA_MP1 to the photolithography apparatus 310.

The photolithography apparatus 310 may perform an exposure process on the chip area CA and the scribe lane area SA of the semiconductor substrate 10 using the received first chip area mask pattern CA_MP1 and the received first scribe lane area mask pattern SA_MP1, respectively. For example, the photolithography apparatus 310 may form a first chip area photoresist pattern on the chip area CA using die first chip area mask pattern CA_MP1 as a mask. For example, the photolithography apparatus 310 may form a first scribe lane area photoresist pattern on the scribe lane area SA using the first scribe lane area mask pattern SA_MP1 as a mask. The photolithography apparatus 310 may expose the photoresist on the semiconductor substrate 10 using the first chip area mask pattern CA_MP1 or the first scribe lane area mask pattern SA_MP1 to form an exposed semiconductor substrate.

The etching apparatus 320 may perform an etching process on the semiconductor substrate 10 that leas been subjected to the exposure process by the photolithography apparatus 310 (e.g., the exposed semiconductor substrate). For example, in an embodiment, the etching apparatus 320 may etch the semiconductor substrate 10 using the photoresist pattern formed by the photolithography apparatus 310 as a mask. However, embodiments of the present n inventive concepts are not limited thereto.

Although it is illustrated that the etching process is performed by the etching apparatus 320 after the exposure process is performed by the photolithography apparatus 310, embodiments of the present inventive concepts are not limited thereto. For example, in an embodiment, the exposure process may be performed by the photolithography apparatus 310 after the etching process is performed by the etching apparatus 320.

In an embodiment, the observing apparatus 330 may generate the image of the semiconductor substrate 10 that has been subjected to the exposure process by the photolithography apparatus 310 and the image of the semiconductor substrate 10 that has been subjected to the etching process by the etching apparatus 320.

For example, as shown in the embodiment of FIG. 7, the observing apparatus 330 may generate a first scribe lane area exposure result SA_P_R1 obtained by imaging the scribe large area SA of the semiconductor substrate 10 that has been subjected to the exposure process using the first chip area mask pattern CA_MP1 and the first scribe lane area mask pattern SA_MP1. For example, the observing apparatus 330 may generate a first scribe lane area etching result SA_E_R1 obtained by imaging the scribe lane area SA of the semiconductor substrate 10 that has been subjected to the etching process using the photoresist pattern formed by the first scribe lane area mask pattern SA_MP1. In an embodiment, the first scribe lane area exposure result SA_P_R1 and the first scribe lane area etching result SA_E_R1 nay be SEM images. However, embodiments of the present inventive concepts are not limited thereto.

The observing module 120 may receive the first scribe lane area exposure result SA_P_R1 and the first scribe lane area etching result SA_E_R1. The observing module 120 may convert the first scribe lane area exposure result SA_P_R1 and the first scribe lane area etching result SA_E_R1 into intensity maps. For example, the first scribe lane area exposure result SA_P_R1 and the first scribe lane area etching result SA_E_R1 may be converted from the SEM images into the intensity maps. However, embodiments of the present inventive concepts are not limited thereto, and the first scribe lane area exposure result SA_P_R1 and the first scribe lane area etching result SA_E_R1 may be both the SEM images and the intensity maps.

Figure 8:
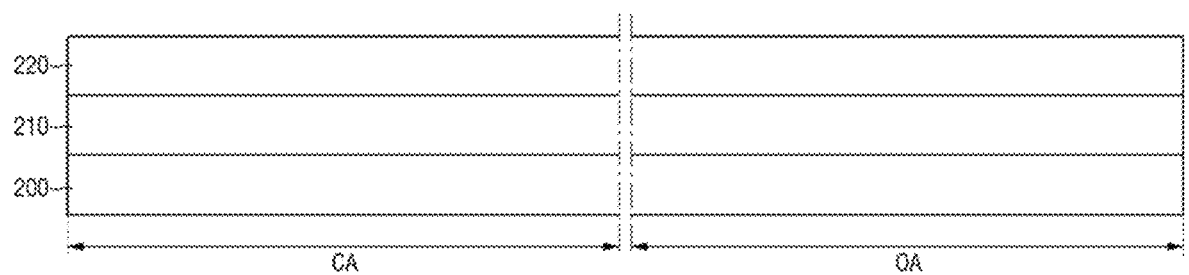
FIGS. 8 to 17 are views illustrating the intermediate steps of a method of manufacturing a semiconductor device according to embodiments of the present inventive concepts.

Referring to the embodiment of FIG. 8, an etching target layer 210 and a mask layer 220 may be sequentially formed on the substrate 200 in which the chip area CA and the overlay key area OA are defined. In an embodiment, the overlay key area OA may be included in the scribe lane area SA. However, embodiments of the present inventive concepts are not limited thereto, and the overlay key area OA may be included in the chip area CA.

For example, in an embodiment, the substrate 200 may be made of one or more semiconductor materials selected from Si, Ge, SiGe, GaP, GaAs, SiC, SiCeC, InAs, and InP. The substrate 200 may include a silicon on insulator (SOI) substrate or a germanium on insulator (GOI) substrate. Alternatively, the substrate 200 may be a rigid substrate such as a glass substrate for display, or a flexible plastic substrate that includes at least one compound selected from polyimide, polyester, polycarbonate, polyethersulfone, polymethylmethacrylate, polyethylenenaphthalate and polyethyleneterephthalate.

In an embodiment, the etching target layer 210 may include silicon nitride or porous oxide such as low-k (LK) and ultra low-k (ULK) materials used in a back-end of line (BEOL) process, phosphor silicate glass (PSG), born-phosphor silicate glass (BPSG), undoped silicate glass (USG), tetraethyl orthosilicate (TEOS), plasma enhanced-TEOS (PE-TEOS), and high density plasma-chemical vapor deposition (HDP-CVD) oxide. In an embodiment, the etching target layer 210 may be formed by performing a CVD process, a plasma enhanced chemical vapor deposition (PECVD) process, a spin coating process, a high density plasma-chemical vapor deposition (HDP-CVD) process, or the like.

The mask layer 220 may be formed on the etching target layer 210. For example, as shown in the embodiment of FIG. 8, a lower surface of the mask layer 220 may directly contact an upper surface of the etching target layer 210. In embodiments in which the etching target layer 210 is not disposed on the substrate 200 the mask layer 220 may be formed directly on the substrate 200. In an embodiment, the mask layer 220 may contain a material having an etching selectivity that is different from the etching selectivity of the substrate 200 or the etching target layer 210. For example, the mask layer 220 may be a material that is hardly etched when the substrate 200 or the etching target layer 210 is etched. For example, in an embodiment the mask layer 220 may contain silicon oxide. However, embodiments of the present inventive concepts are not limited thereto.

In an embodiment, the mask layer 220 may be deposited onto the etching target layer 210 by a plasma enhanced chemical vapor deposition (PECVD) process. Further, the mask layer 220 may be formed using a silicon-based spin-on hard mask (Si—SOH) such as spin-on glass (SOG) or the like. In an embodiment, an anti-reflection layer may be further formed on the mask layer 220. For example, the anti-reflection layer may contain silicon oxynitride (SiON). The anti-reflection layer may be formed by a CVD process or the like.

Figure 9:
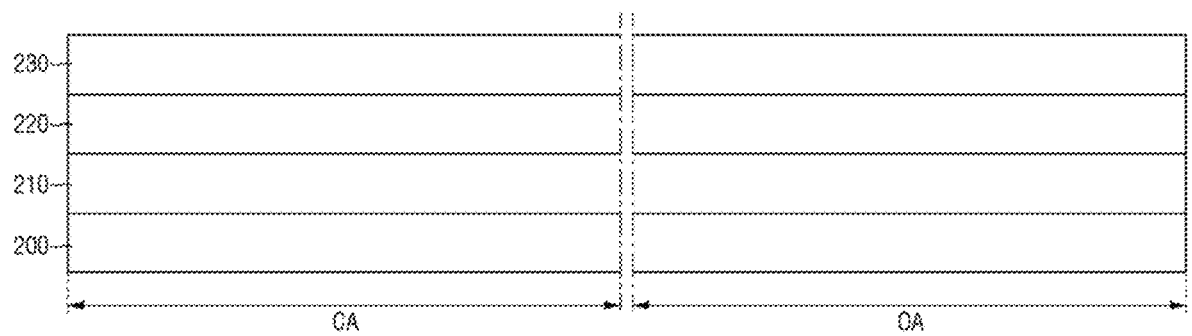

Referring to the embodiment of FIG. 9, a first pattern layer 230 may be formed on the mask layer 220. For example, the first pattern layer 230 may be made of a carbon-spin on hardmask material including about 99% of carbon. For example, the first pattern layer 230 may be a first spin-on hardmask (first SOH) material. In an embodiment, the first pattern layer 230 may be formed by spin-coating the first spin-on hard mask material onto the mask layer 220 and then curing it by performing baking at a temperature in a range of about 350° C. to about 450° C.

Figure 10:
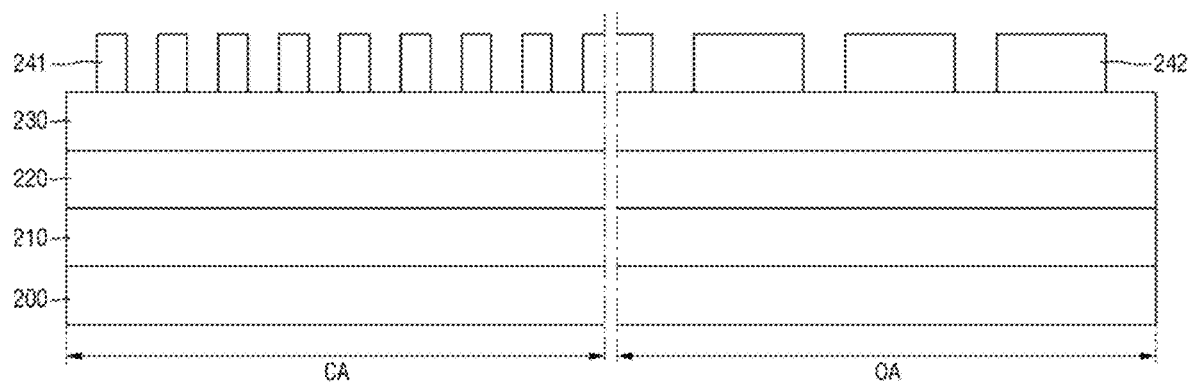

Referring to the embodiment of FIG. 10, first chip area photoresist patterns 241 and first scribe lane area photoresist patterns 242 may be formed on the first pattern layer 230.

The first chip area photoresist patterns 241 and the first scribe lane area photoresist patterns 242 may be formed by performing an exposure process on a photoresist. As shown in the embodiment of FIG. 10, the first chip area photoresist patterns 241 may be formed on the first pattern layer 230 in the chip area CA. The first scribe lane area photoresist patterns 242 may be formed on the first pattern layer 230 in the overlay key area OA.

Referring to the embodiments of FIGS. 7 and 10, the photolithography apparatus 310 may form the first chip area photoresist patterns 241 by performing the exposure process on the photoresist using the first chip area mask pattern CA_MP1 as a mask. Further, the photolithography apparatus 310 may form the first scribe lane area photoresist patterns 242 by performing the exposure process on the photoresist using the first scribe lane area mask pattern SA_MP1 as a mask.

As shown in the embodiment of FIG. 10, the arrangement density of the first chip area photoresist patterns 241 may be higher than the arrangement density of the first scribe lane area photoresist patterns 242. For example, the number of the first chip area photoresist patterns 241 arranged in a certain area may be greater than the number of the first scribe lane area photoresist patterns 242 arranged in the same area. In an embodiment, the density of circuits formed in the chip area CA may be higher than the density of circuits formed in the overlay key area OA. However, embodiments of the present inventive concepts are not limited thereto.

Figure 11:
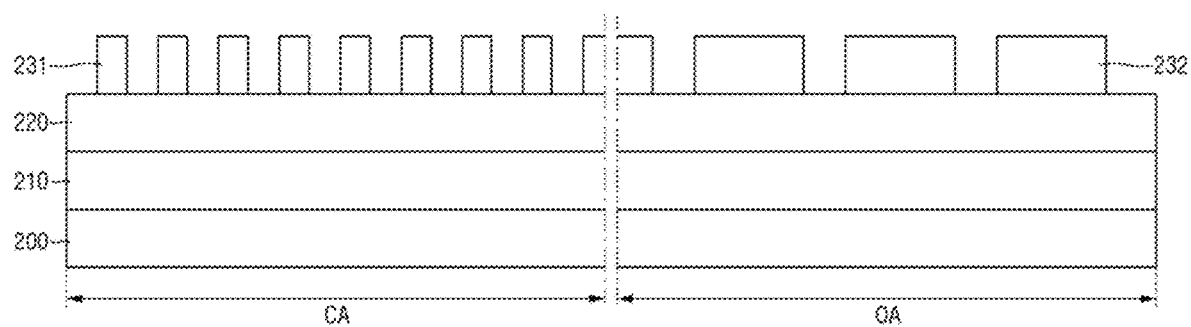

Referring to the embodiment of FIG. 11, first patterns 231 and second patterns 232 may be formed on the mask layer 220. The first patterns 231 and the second patterns 232 may be formed by etching the first pattern layer 230. For example, the etching apparatus 320 may etch the first pattern layer 230 using the first chip area photoresist patterns 241 and the first scribe lane area photoresist patterns 242 as masks. In an embodiment, the first patterns 231 and the second patterns 232 may be formed by removing the first chip area photoresist patterns 241 and the first scribe lane area photoresist patterns 242 after the etching process is completed.

Figure 12:
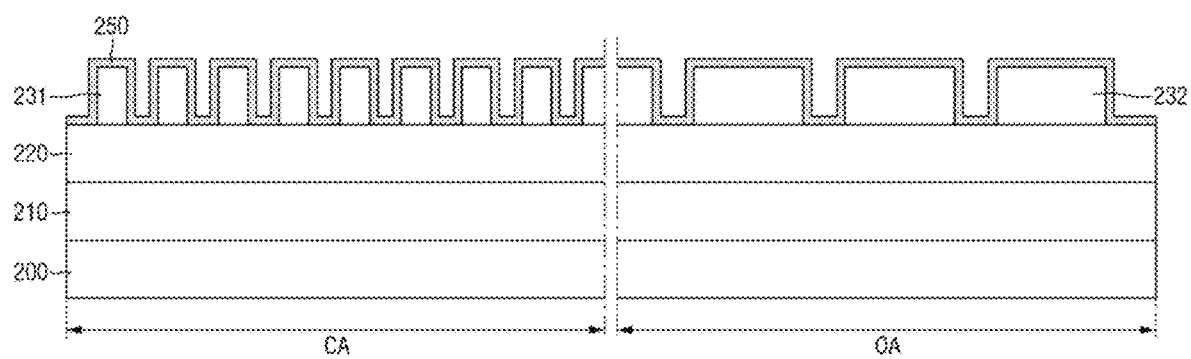

Referring to the embodiment of FIG. 12, a spacer layer 250 may be formed on the first patterns 231 and the second patterns 232. For example, the spacer layer 250 may be conformally formed along the first patterns 231 and the second patterns 232. In an embodiment, the spacer layer 250 may be formed by the deposition apparatus 340. However, embodiments of the present inventive concepts are not limited thereto.

In an embodiment, the spacer layer 250 may contain a material having different etching selectivities with respect to the first patterns 231 and the second patterns 232. For example, in an embodiment, the spacer layer 250 may be formed using silicon oxide such as medium temperature oxide (MTO), high temperature oxide (HTO), or ALD oxide. However, embodiments of the present inventive concepts are not limited thereto.

Figure 13:
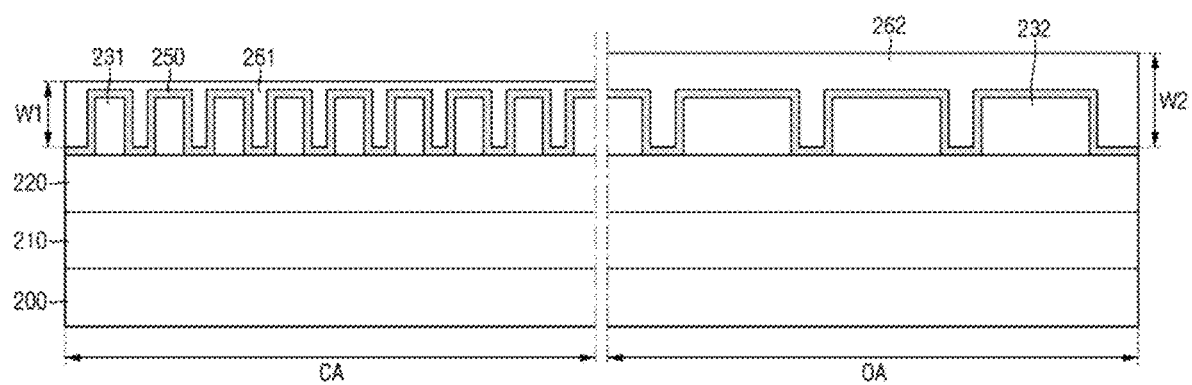

Referring to the embodiment of FIG. 13, a chip area second pattern layer 261 anal a overlay key area second pattern layer 262 may be formed on the spacer layer 250. The chip area second pattern layer 261 and the overlay key area second pattern layer 262 may fill the spaces of the conformally formed spacer layer 250. The chip area second pattern layer 261 and the overlay key area second pattern layer 262 may cover the spacer layer 250. The chip area second pattern layer 261 may be funned in the chip area CA, and the overlay key area second pattern layer 262 may be formed in the overlay key area OA.

In an embodiment, the chip area second pattern layer 261 and the overlay key area second pattern layer 262 may be made of a carbon-spin on hardmask material including about 99% of carbon. For example, the chip area second pattern layer 261 and the overlay key area second pattern layer 262 may be a first spin-on hardmask (first SOH) material. The chip area second pattern layer 261 and the overlay key area second pattern layer 262 may contain the same material as that of the first pattern layer 230. In an embodiment, the chip area second pattern layer 261 and the overlay key area second pattern layer 262 may be formed by the deposition apparatus 340.

The thickness of the overlay key area second pattern layer 262 may be a second thickness W2, and the thickness of the chip area second pattern layer 261 may be a first thickness. As shown in the embodiment of FIG. 13, the second thickness W2 may be greater than the first thickness W1. Therefore, the thickness of the overlay key area second pattern layer 262 formed on the protruding portions of the spacer layer 250 and the second pattern 232 may be greater than the thickness of the chip area second pattern layer 261 formed on the protruding portions of the spacer layer 250 and the first pattern 231. For example, the thickness of the overlay key area second pattern layer 262 may be greater than the thickness of the chip area second pattern layer 261 due to the arrangement density of the first patterns 231 being higher than the arrangement density of the second patterns 232. However, embodiments of the present inventive concepts are not limited thereto.

Figure 14:
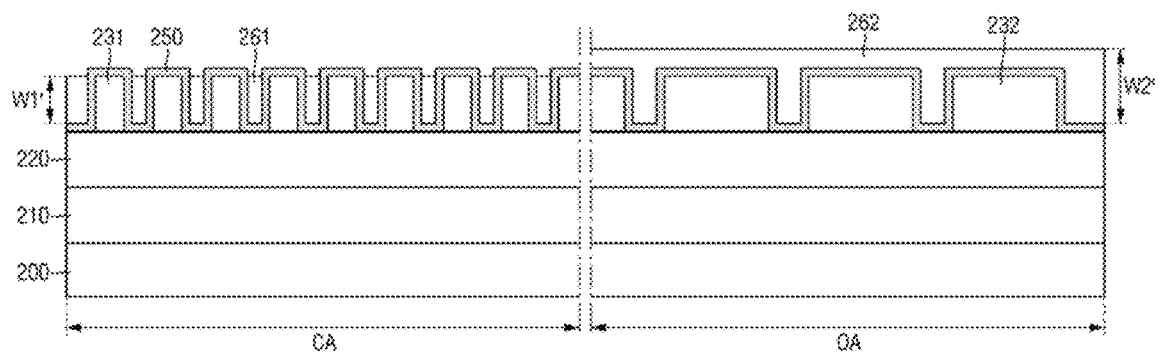

Referring to the embodiment of FIG. 14, the chip area second pattern layer 261 and the overlay key area second pattern layer 262 may be etched. For example, the top surface of the spacer layer 250 may be exposed by etching the chip area second pattern layer 261. However, even if the overlay key area second pattern layer 262 is etched, due to the greater thickness overlay key area second pattern layer 262, the top surface of the spacer layer 250 may not be exposed. For example, the spacer layer 250 disposed in the chip area CA may be exposed on the top surface of the semiconductor substrate 10, whereas the spacer layer 250 disposed in the overlay key area OA may not be exposed on the top surface of the semiconductor substrate 10.

For example, as shown in the embodiment of FIG. 14, a second thickness W2' of the etched overlay key area second pattern layer 262 may be greater than the thickness of the etched chip area second pattern layer 261.

Figure 15:
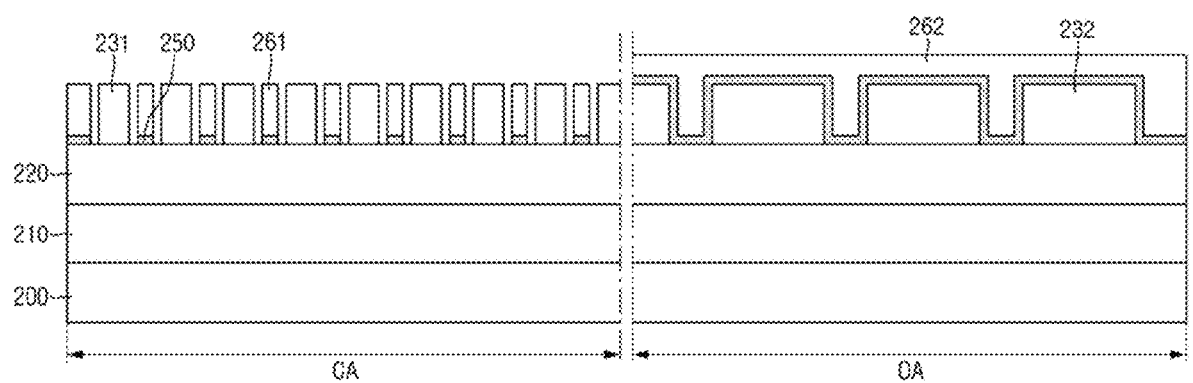

Referring to the embodiment of FIG. 15, a partial portion of the spacer layer 250 may be removed by an etch-back process. For example, the portion of the spacer layer 250 in the chip area CA may be removed. By removing the spacer layer 250 disposed in the chip area CA, the top surface and the sidewalls of the first pattern 231 may be exposed and the top surface and the sidewalk of the chip area second pattern layer 261 may be exposed, and a partial portion of the top surface of the mask layer 220 may be exposed. As shown in the embodiment of FIG. 15, a partial portion of the spacer layer 250 may be disposed below the chip area second pattern layer 261 after the etch-back process.

However, the spacer layer 250 disposed in the overlay key area OA may not be removed. For example, the entire portion of the spacer layer 250 in the overlay key area OA may not be removed. For example, the overlay key area second pattern layer 262 remains on the spacer layer 250, so that the spacer layer 250 may not be etched by the etching apparatus 320.

Figure 16:
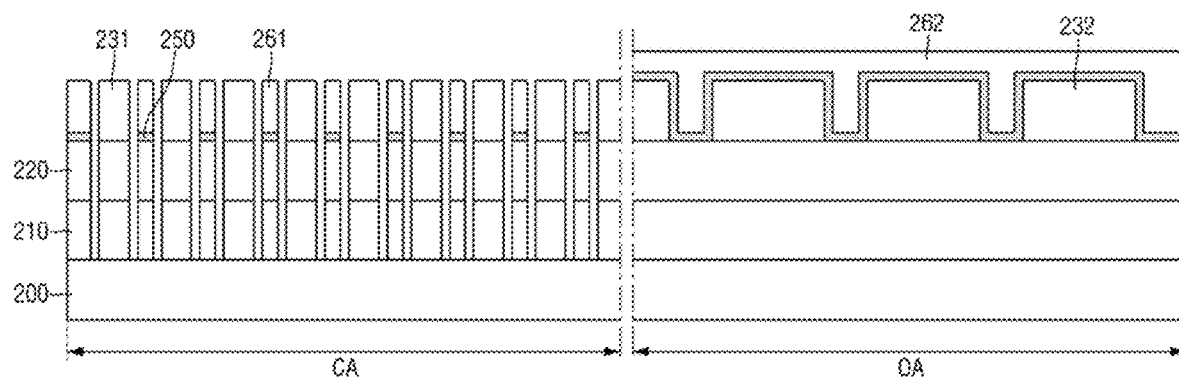

Referring to the embodiment of FIG. 16, the etching apparatus 320 may etch the mask layer 220 and the etching target layer 210 using the first patterns 231 and the chip area second pattern layer 261 as masks. However, the overlay key area second pattern layer 262 disposed in the overlay key area OA may not be etched by the etching apparatus 320.

Figure 17:
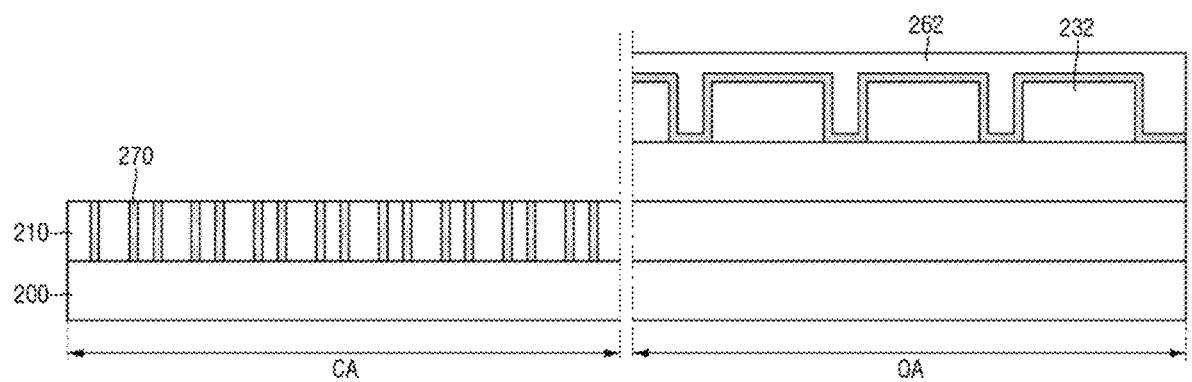

Referring to the embodiment of FIG. 17, the first patterns 231, the chip area second pattern layer 261, the spacer layer 250, and the mask layer 220 disposed in the chip area CA may be removed. Further, a metal layer 270 may fill the trenches defined by the etching target layer 210 and the substrate 200. However, the overlay key area second pattern layer 262 in the overlay key area OA still may not be removed.

Figure 18:
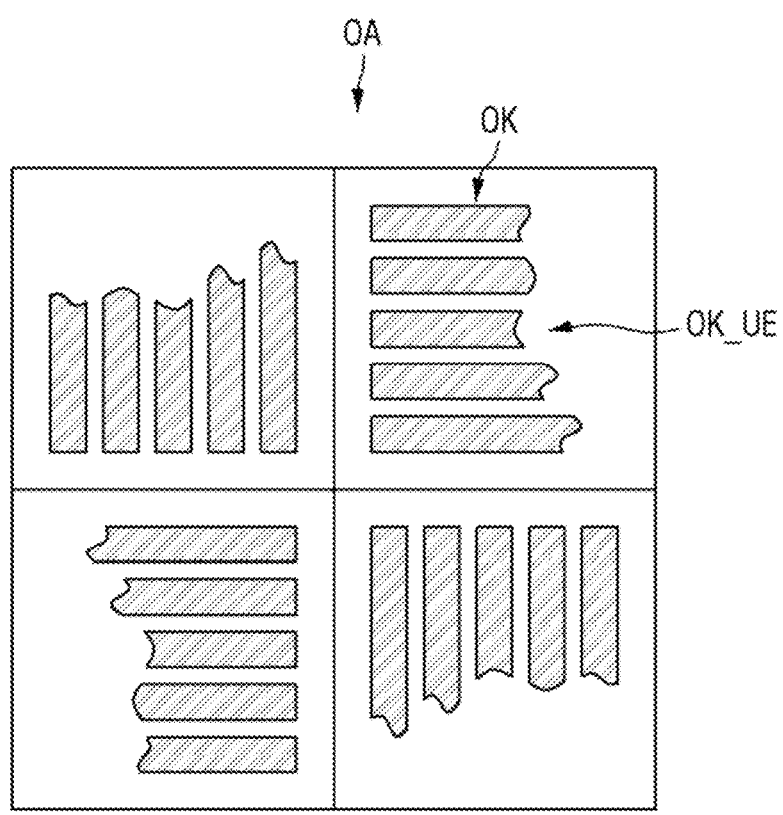
FIG. 18 is an enlarged view of the overlay key area formed by the semiconductor device manufacturing method described with reference to FIGS. 7 to 17 according to an embodiment of the present inventive concepts.

FIG. 18 is an enlarged view of the overlay key area formed by the semiconductor device manufacturing method described with reference to the embodiments of FIGS. 7 to 17.

Referring to the embodiment of FIG. 18, overlay key patterns OK may be formed in the overlay key area OA. As shown in the embodiment of FIG. 18, the overlay key patterns OK may include unetched overlay key patterns OK_UE. The unetched overlay key patterns OK_UE may be formed in a partial portion of the overlay key area OA.

The unetched overlay key patterns OK_UE may correspond to the overlay key area OA of the semiconductor substrate 10 described with reference to the embodiments of FIGS. 7 to 17. For example, the unetched overlay key patterns OK_UE may include the etching target layer 210, the mask layer 220, the second patterns 232, the spacer layer 250 and the overlay key area second pattern layer 262 in the overlay key area OA. For example, the top surfaces of the unetched overlay key patterns OK_UE may be the unetched overlay key area second pattern layer 262. However, embodiments of the present inventive concepts are not limited thereto.

In a comparative embodiment, the circuit in the chip area CA may be normally formed by an etching process, whereas a portion of the overlay key patterns OK in the overlay key area OA may not be formed. This may be because the chip area second pattern layer 261 and the overlay key area second pattern layer 262 are formed with different thicknesses. However, in an embodiment of the present inventive concepts, the chip area second pattern hoer 261 and the overlay key area 262 may be formed with substantially the same thickness as described in more detail below.

In an embodiment, the process of manufacturing the semiconductor substrate 10 described with reference to the embodiments of FIGS. 8 to 17 may be a self-aligned double patterning (SADP) process.

Hereinafter, a semiconductor device manufacturing system 3 according to the technical spirit of the present inventive concepts will be described with reference to the embodiments of FIGS. 19 to 31.

Figure 19:
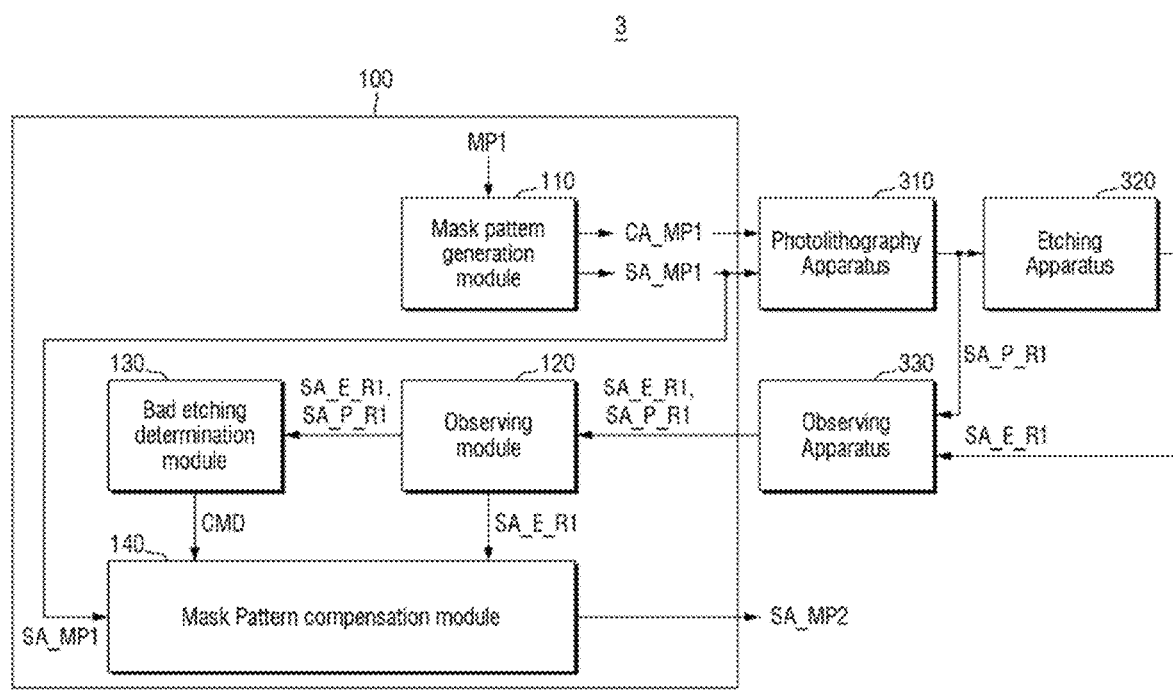
FIG. 19 is a block diagram of a semiconductor device manufacturing system according to an embodiment of the present inventive concepts.
Figure 20:
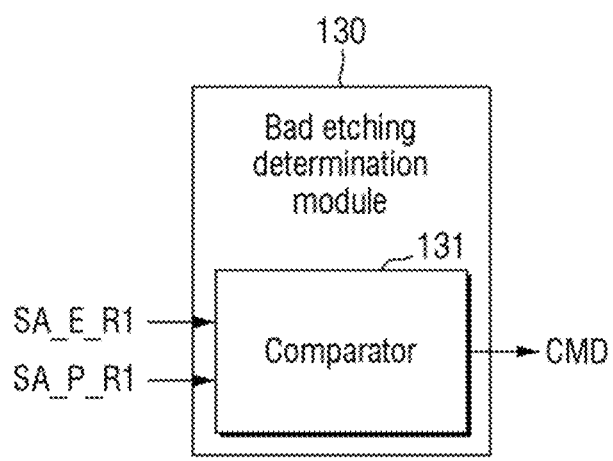
FIG. 20 is a block diagram of a bad etching determination module of FIG. 19 according to an embodiment of the present inventive concepts.
Figure 21:
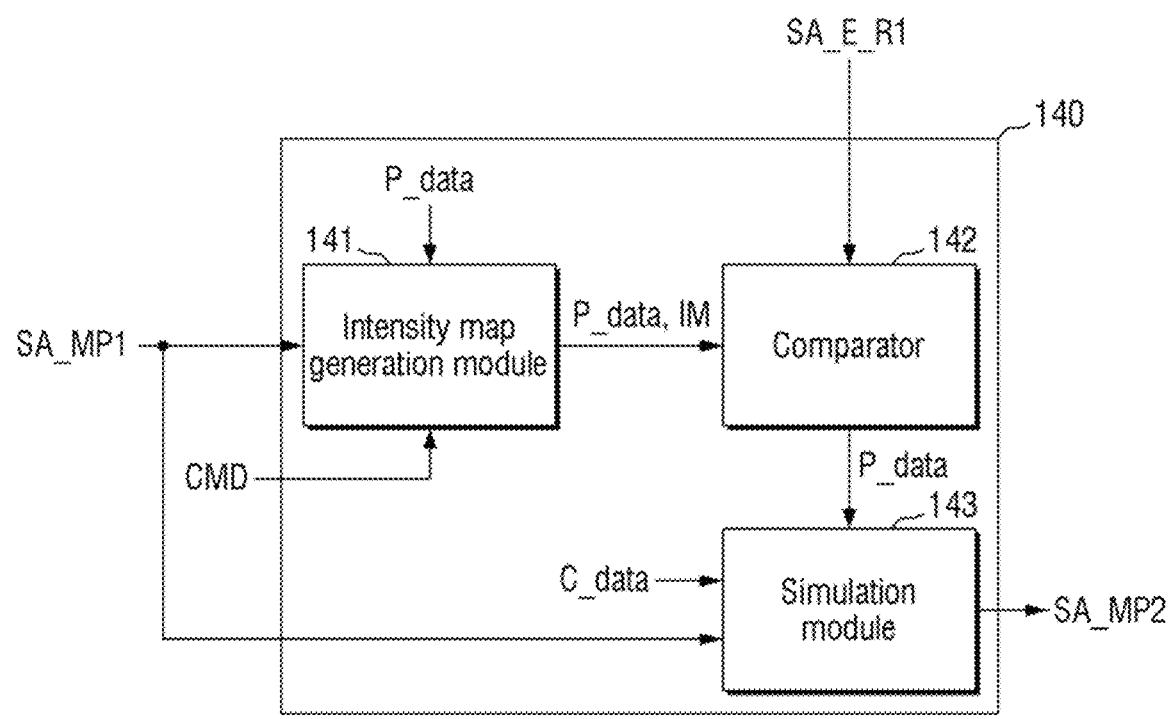
FIG. 21 is a block diagram of a mask pattern compensation module of FIG. 19 according to an embodiment of the present inventive concepts.
Figure 22:
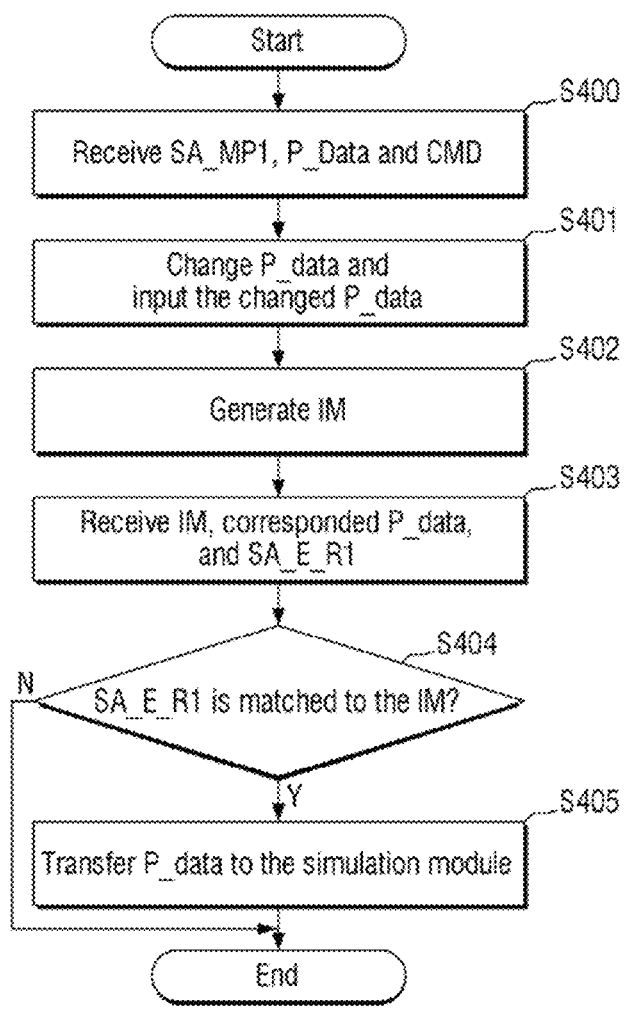
FIG. 22 is a flowchart of an operation of the mask pattern compensation module according to an embodiment of the present inventive concepts.
Figure 23:
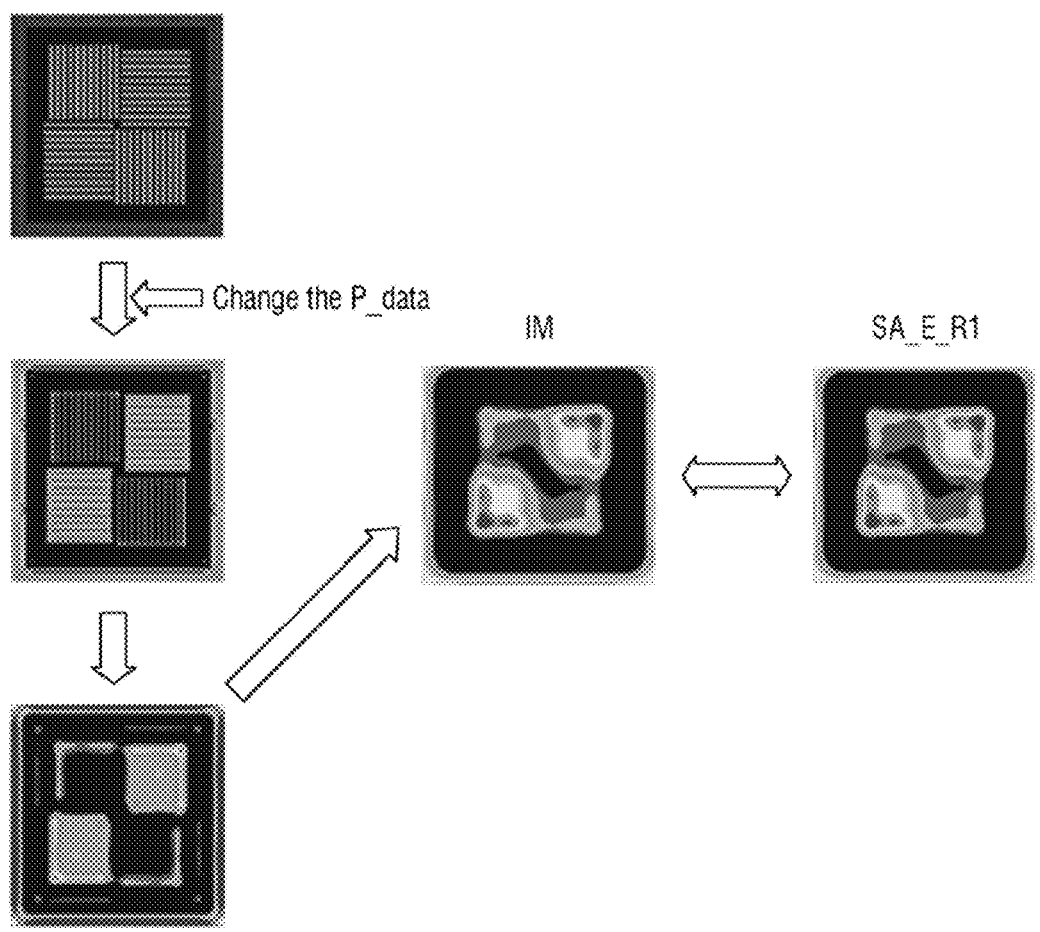
FIG. 23 is a diagram of an operation of the mask pattern compensation module according to an embodiment of the present inventive concepts.
Figure 24:
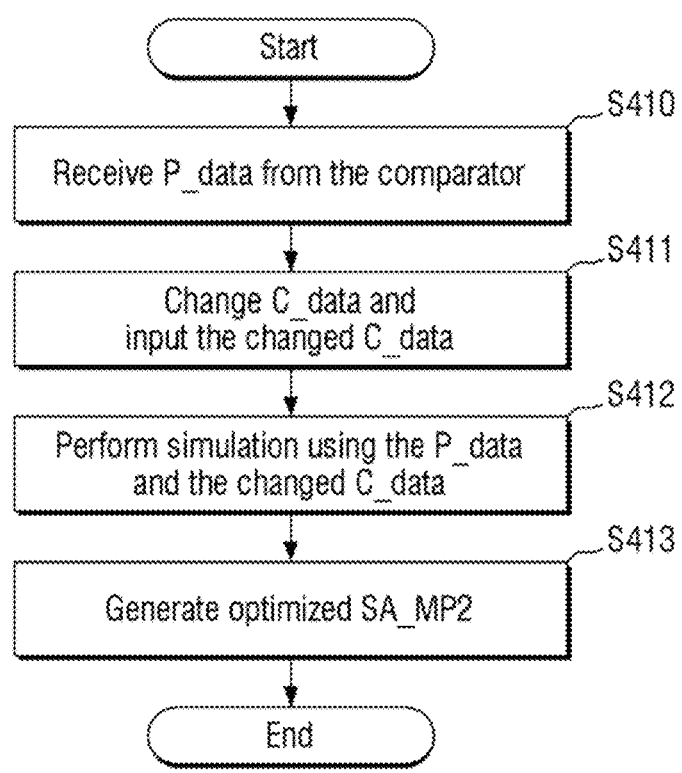
FIG. 24 is a flowchart of an operation of the simulation module according to an embodiment of the present inventive concepts.
Figure 25:
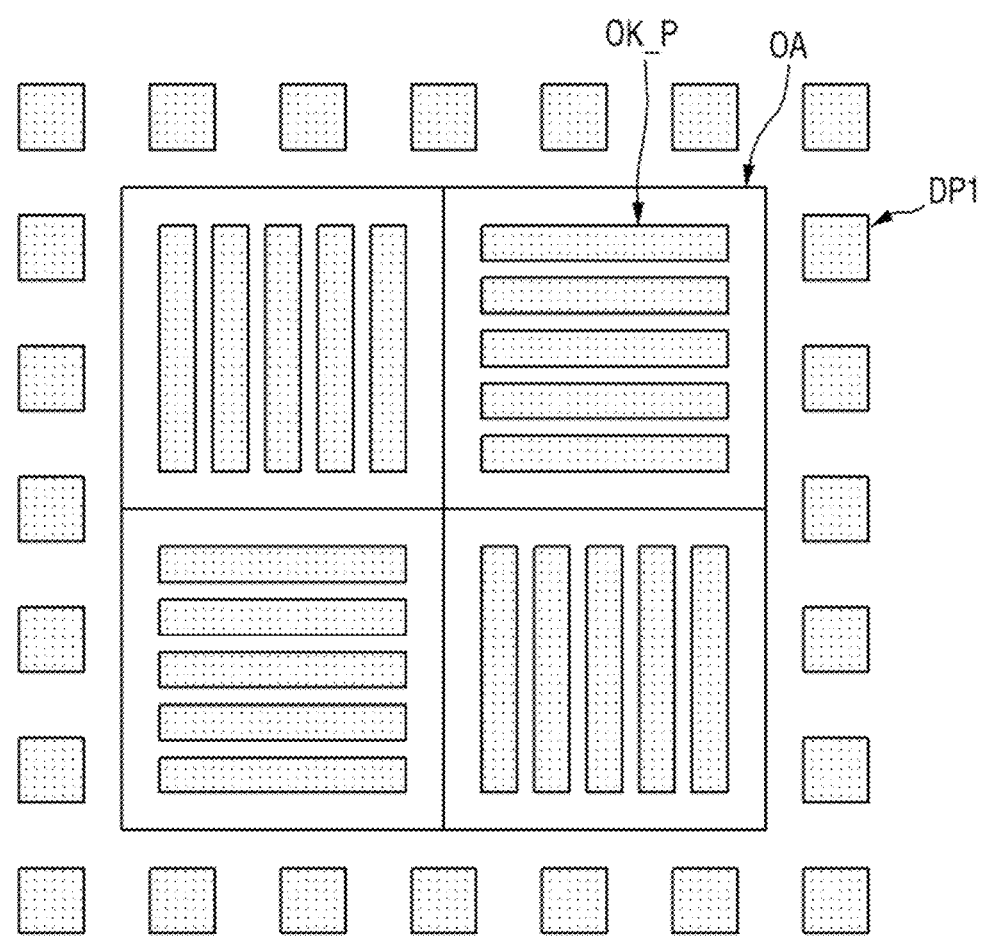
FIGS. 25 and 26 are diagrams of an operation of the simulation module according to embodiments of the present inventive concepts.
Figure 26:
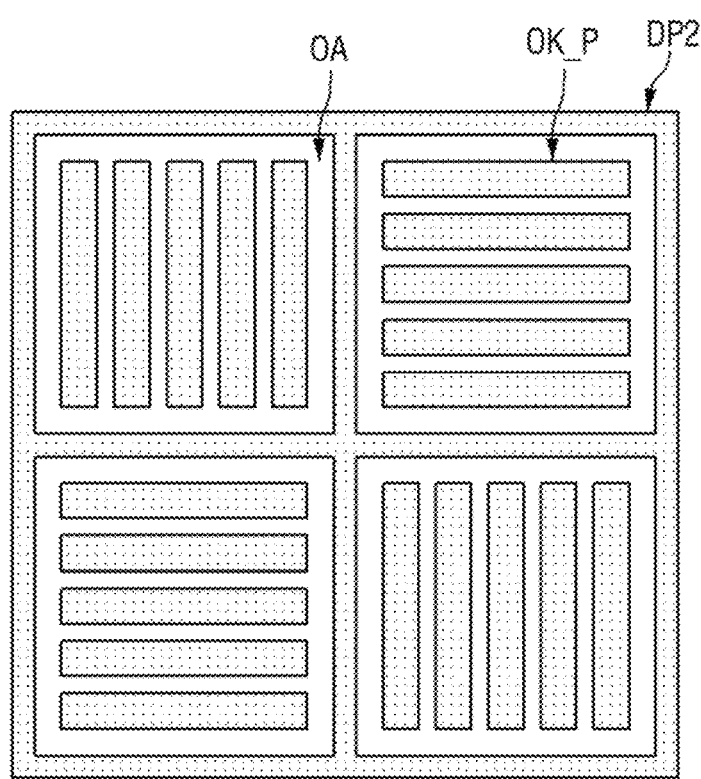

FIG. 19 is a block diagram of a semiconductor device manufacturing system according to an embodiment of the present inventive concepts. FIG. 20 is a block diagram of a bad etching determination module of FIG. 19. FIG. 21 is a block diagram of a mask pattern compensation module of FIG. 19. FIG. 22 is a flowchart for explaining the operation of the mask pattern compensation module according to an embodiment of the present inventive concepts. FIG. 23 is a diagram for explaining the operation of the mask pattern compensation module according to an embodiment of the present inventive concepts. FIG. 24 is a flowchart for explaining the operation of the simulation module according to an embodiment of the present inventive concepts. FIGS. 25 and 26 are diagrams for explaining the operation of the simulation module according to embodiments of the present inventive concepts.

Referring to the embodiment of FIG. 19, the semiconductor device manufacturing system 3 may include a controller 100, a photolithography apparatus 310, an etching apparatus 320, and an observing apparatus 330. In an embodiment, a mask pattern generation module 110, an observing module 120, the photolithography apparatus 310, the etching apparatus 320, and the observing apparatus 330 may be the same as the mask pattern generation module 110, the observing module 120, the photolithography apparatus 310, the etching apparatus 320, and the observing apparatus 330 of the semiconductor device manufacturing system 2 described with reference to the embodiment of FIG. 7.

The controller 100 may include the mask pattern generation module 110, the observing module 120, a bad etching determination module 130, and a mask pattern compensation module 140.

As shown in the embodiment of FIG. 19, the bad etching determination module 130 may receive a first scribe lane area exposure result SA_P_R1 and a first scribe lane area etching result SA_E_R1 from the observing module 120. The bad etching determination module 130 may determine whether or not the etching of the semiconductor substrate 10 formed by the photolithography apparatus 310 and the etching apparatus 320 was incorrect and in deviation from the predetermined etching result corresponding to the exposure by the photolithography apparatus based on the received first scribe lane area exposure result SA_P_R1 and the received first scribe lane area etching result SA_E_R1.

Referring to the embodiment of FIG. 20, the bad etching determination module 130 may include a comparator 131. The comparator 111 may determine whether or not the etching state of the scribe lane area SA of the semiconductor substrate 10 is incorrect by comparing the first scribe lane area exposure result SA_P_R1 with the first scribe lane area etching result SA_E_R1.

For example, when the first scribe lane area exposure result SA_P_R1 is normal (e corresponds to a predetermined exposure result), if an unetched portion exists in the first scribe lane area etching result SA_E_R1, the comparator 131 may transfer a command CMD to the mask pattern compensation module 140. However, when the first scribe lane area exposure result SA_P_R1 corresponds (e.g., is matched) to the first scribe lane area etching result SA_E_R1, the comparator 131 may not transfer the command CMD to the mask pattern compensation module 140.

Referring back to the embodiment of FIG. 19, the mask pattern compensation module 140 may receive the first scribe lane area etching result SA_E_R1 from the observing module 120. The mask pattern compensation module 140 may receive the command CMD from the bad etching determination module 130. The mask pattern compensation module 140 may receive a first scribe lane area mask pattern SA_MP1 from the mask pattern generation module 110.

Referring to the embodiment of FIG. 21, the mask pattern compensation module 140 may include an intensity map generation module 141, a comparator 142, a simulation module 143, or the like.

Referring to the embodiments of FIGS. 21 and 22, the intensity map generation module 141 may receive the first scribe lane area mask pattern SA_MP1, the command CMD, and exposure data P_data in block S400. For example, the intensity map generation module 141 may receive the first scribe lane area mask pattern SA_MP1 from the mask pattern generation module 110 and receive the command CMD from the bad etching determination module 130. The intensity map generation module 141 may proceed with the generation of an intensity map IM, such as an intensity map for the first scribe lane area mask pattern SA_MP1, only when the command CMD is received.

The exposure data P_data may be a data value used for the exposure process of the photolithography apparatus 310. For example, the exposure data P_data may include the wavelength of incident light, a numerical aperture NA, and the like. However, embodiments of the present inventive concepts are not limited thereto.

The mask pattern compensation module 140 may change the exposure data P_data and provide the changed exposure data P_data to the intensity map generation module 141 in block S401. For example, the mask pattern compensation module 140 may generate and provide various exposure data P_data to the intensity map generation module 141.

The intensity map generation module 141 may generate the intensity map based on the received exposure data P_data (e.g., the changed exposure data P_data) and the received first scribe lane area mask pattern SA_MP1 in block S402. For example, the intensity map generation module 141 may generate the intensity map IM by applying the exposure data P_data to the first scribe lane area mask pattern SA_MP1.

The comparator 142 may receive the intensity map IM, the exposure data P_data, and the first scribe lane area etching result SA_E_R1 in block S403. For example, the comparator 142 may receive the intensity map IM and the exposure data P_data used for the generation of the intensity map IM from the intensity map generation module 141. Further, for example, the comparator 142 may receive the first scribe lane area etching result SA_E_R1 from the observing module 120.

The comparator 142 may determine whether or not the first scribe lane area etching result SA_E_R1 corresponds (e.g., is latched) to the intensity map IM in block S404. For example, in an embodiment, the comparator 142 may compare the first scribe lane area etching result SA_E_R1 with the intensity map IM to determine whether or not the first scribe lane area etching result SA_E_R1 and the intensity map IM are the same image.

When the first scribe lane area etching result SA_E_R1 corresponds (e.g., is matched) to the intensity map IM (e.g., Y in block S404), the comparator 142 may transfer the corresponding exposure data P_data to the simulation module 143 in block S405. When the first scribe lane area etching result SA_E_R1 is not matched to the intensity map IM (e.g., N in block S404), the comparator 142 may not transfer the corresponding exposure data P_data to the simulation module 143.

Referring to the embodiment of FIG. 23, the intensity map IM may be generated by applying the exposure data P_data to the first scribe lane area mask pattern SA_MP1. For example, the intensity map generation module 141 may generate the intensity map IM by applying the changed exposure data P_data to the first scribe lane area mask pattern SA_MP1.

In an embodiment, the comparator 142 may provide the corresponding exposure data P_data to the simulation module 141 when the generated intensity map IM corresponds (e.g., is matched) to the first scribe lane area etching result SA_E_R1.

Referring back to the embodiment of FIG. 21, the simulation module 143 may receive the first scribe lane area mask pattern SA_MP1, the exposure data P_data, and correction data C_data.

Referring to the embodiments of FIGS. 21 and 24, the simulation module 143 may receive the exposure data P_data from the comparator 142 in block S410. The received exposure data P_data may be the exposure data P_data when the intensity map IM corresponds (e.g., is matched) to the first scribe lane area etching result SA_E_R1.

The mask pattern compensation module 140 may change the correction data C_data and provide the changed correction data C_data to the simulation module 143 in block S411. For example, the mask pattern compensation module 140 may generate and provide various correction data C_data to the simulation module 143.

The simulation module 143 may perform simulation using the received exposure data P_data and the changed correction data C_data in block S412. For example, the simulation module 143 may generate an optimized second scribe lane area mask pattern SA_MP2 by performing the simulation by applying the received exposure data P_data and the changed correction data C_data to the first scribe lane area mask pattern SA_MP1 in block S413.

For example, in an environment where the exposure data P_data determined by the intensity map generation module 141 and the comparator 142 is applied, the simulation module 143 may perform a correction by applying the correction data C_data to the first scribe lane area mask pattern SA_MP1. For example, by generating the new second scribe lane area mask pattern SA_MP2 by applying the correction data C_data to the first scribe lane area mask pattern SA_MP1, a height difference between the material layer formed in the scribe lane area SA or the overlay key area OA and the material layer formed in the chip area CA may be reduced.

In an embodiment, the correction data C_data may include a dummy mask pattern. The dummy mask pattern may include a first dummy mask pattern and a second dummy mask pattern. However, embodiments of the present inventive concepts are not limited, thereto, and the correction data C_data may include the first scribe lane area mask pattern SA_MP1.

The first dummy mask pattern may be formed on the scribe lane area SA and may be disposed around the first scribe lane area mask pattern SA_MP1. For example, the first dummy mask pattern may surround the first scribe lane area mask pattern SA_MP1. Referring to the embodiment of FIG. 25, first dummy patterns DP1 formed by the first dummy mask pattern may be disposed around the overlay key area OA. Further, the shape of the overlay key patterns OK_P formed by the second scribe lane area mask pattern SA_MP2 may be different from the shape of the conventional overlay key patterns OK.

The second dummy mask pattern may overlap the first scribe lane area mask pattern SA_MP1. Referring to the embodiment of FIG. 26, a second dummy pattern DP2 formed by the second dummy mask pattern may be disposed outside the overlay key area OA. The second dummy pattern DP2 may be disposed around the overlay key patterns OK_P.

Referring back to the embodiment of FIG. 21, the simulation module 143 may output the second scribe lane area mask pattern SA_MP2 generated by the above-described processes.

Figure 27:
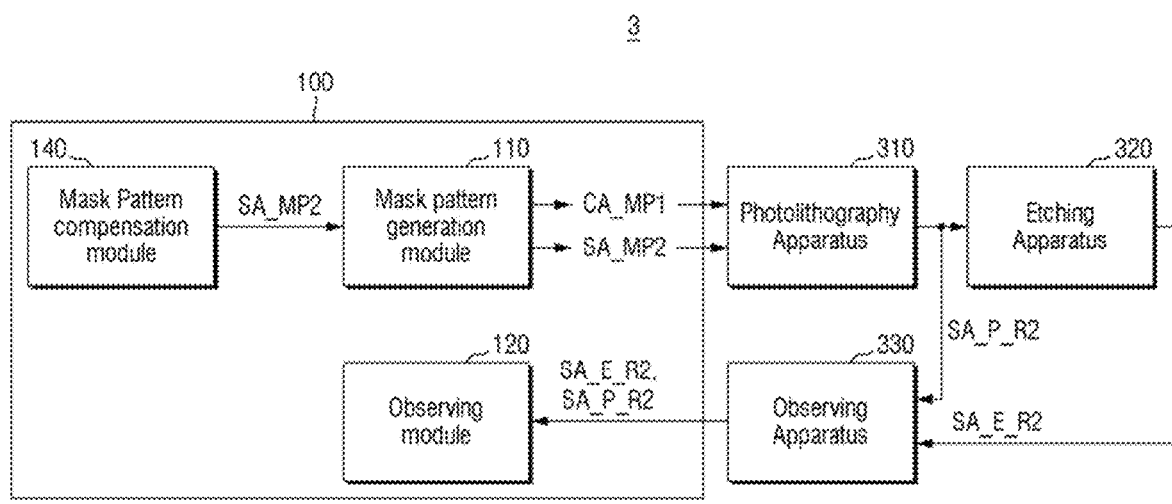
FIG. 27 is a block diagram illustrating a semiconductor device manufacturing system according to an embodiment of the present inventive concepts.

FIG. 27 is a block diagram illustrating a semiconductor device manufacturing system according to an embodiment of the present inventive concepts.

Referring to the embodiment of FIG. 27, the mask pattern generation module 110 may receive the second scribe lane area mask pattern SA_MP2 from the mask pattern compensation module 140. As shown in the embodiment of FIG. 27, the mask pattern generation module 110 may provide the conventional first chip area mask pattern CA_MP1 and the newly received second scribe lane area mask pattern SA_MP2 to the photolithography apparatus 310.

The observing apparatus 330 may provide the second scribe lane area exposure result SA_P_R2 and second scribe lane area etching result SA_E_R2 obtained by imaging the semiconductor substrate 10 that has been subjected to the exposure process and the etching process using the first chip area mask pattern CA_MP1 and the second scribe lane area mask pattern SA_MP2 to the observing module 120.

Figure 28:
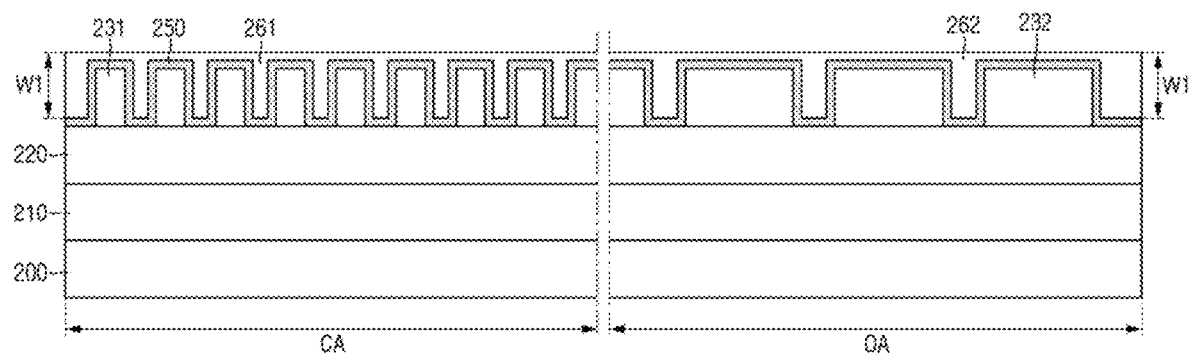
FIGS. 28 to 30 are views illustrating the intermediate steps of a method of manufacturing a semiconductor device according to embodiments of the present inventive concepts.
Figure 29:
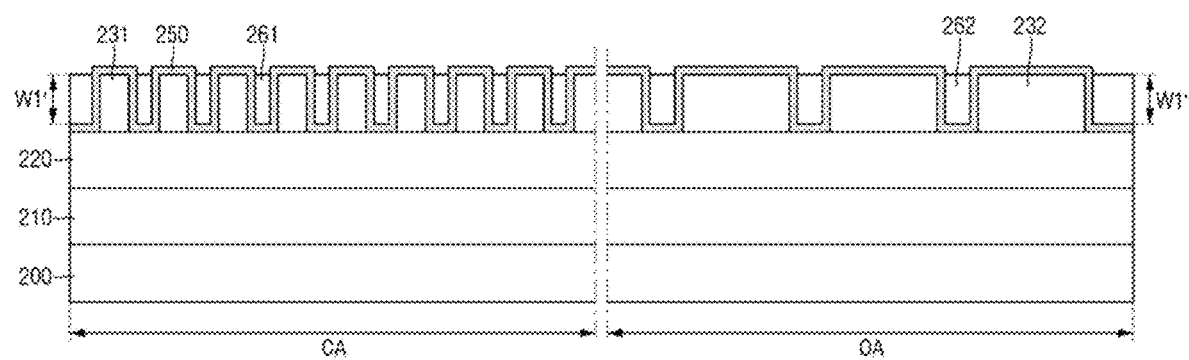
Figure 30:
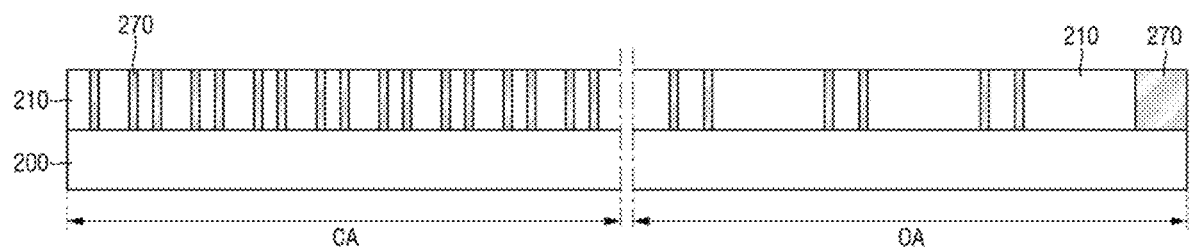
Figure 31:
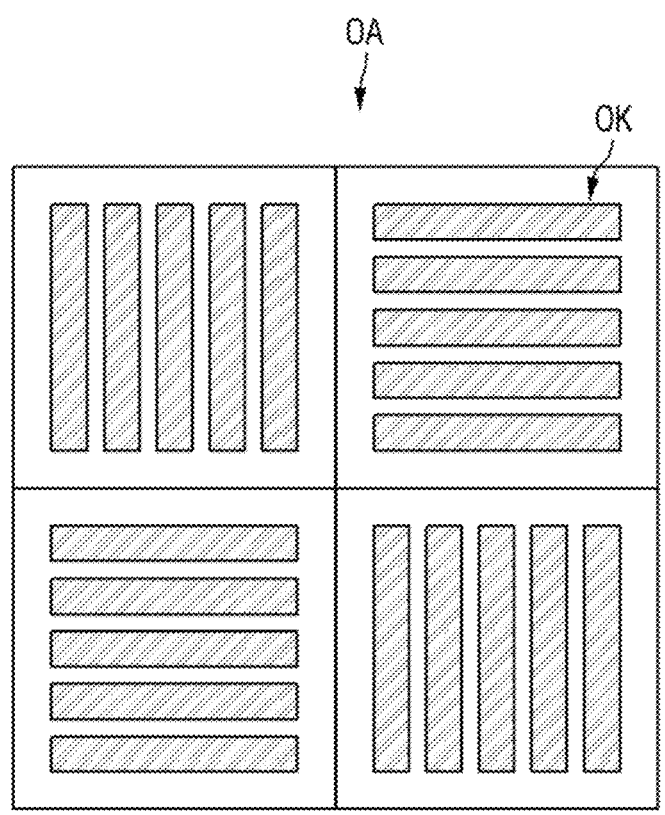
FIG. 31 is an enlarged view of the overlay key area formed by the semiconductor device manufacturing method described with reference to FIGS. 27 to 30 according to an embodiment of the present inventive concepts.

FIGS. 28 to 30 are views illustrating the intermediate steps of a method of manufacturing a semiconductor device according to embodiments of the present inventive concepts. FIG. 31 is an enlarged view of the overlay key area formed by the semiconductor device manufacturing method described with reference to the embodiments of FIGS. 27 to 30.

The semiconductor substrate 10 of FIG. 28 may be the same as the semiconductor substrate 10 formed by the semiconductor device manufacturing method described with reference to the embodiments of FIGS. 8 to 12. Further, although the semiconductor substrate 10 described with reference to the embodiments of FIGS. 8 to 17 is exposed and etched based on the first chip area mask pattern CA_MP1 and the first scribe lane area mask pattern SA_MP1, the semiconductor substrate 10 described with reference to the embodiments of FIGS. 28 to 31 may be exposed and etched based on the first chip area mask pattern CA_MP1 and the newly generated second scribe lane area mask pattern SA_MP2.

Referring to the embodiment of FIG. 28, a chip area second pattern layer 261 and an overlay key area second pattern layer 262 may be formed on a spacer layer 250. The thickness of the chip area second pattern layer 261 may be a first thickness W1, and the thickness of the overlay key area second pattern layer 262 may be the first thickness W1. For example, the thickness of the chip area second pattern layer 261 and the thickness of the overlay key area second pattern layer 262 may be substantially the same.

Referring to the embodiment of FIG. 29, the top surface of the spacer layer 250 may be exposed by etching the chip area second pattern layer 261 and the overlay key area second pattern layer 262. The thickness of the chip area second pattern layer 261 may be a first thickness W1', and the thickness of the overlay key area second pattern layer 262 may be the first thickness W1'. For example, the thickness of the etched chip area second pattern layer 261 and the thickness of the etched overlay key area second pattern layer 262 may be substantially the same.

Referring to the embodiment of FIG. 30, an etching target layer 210 and a metal layer 270 may be formed on the substrate 200 by etching the chip area second pattern layer 261, the overlay key area second pattern layer 262, the spacer layer 250, and the like. In this embodiment, circuit patterns may be formed on the chip area CA and overlay key patterns may be formed on the overlay key area OA. For example, the overlay key area OA of the semiconductor substrate 10 of the embodiment of FIG. 17 is not etched, whereas the overlay key area OA of the semiconductor substrate 10 of the embodiment of FIG. 30 may be normally etched.

Referring to the embodiment of FIG. 1, the overlay key patterns OK may be formed on the overlay key area OA by the above-described method.

As shown in the embodiment of FIG. 13, the second thickness W2 of the overlay key area second pattern layer 262 is greater than the first thickness W1 of the chip area second pattern layer 261 in the semiconductor substrate 10 that has beet exposed and etched based on the first chip area mask pattern CA_MP1 and the first scribe lane area mask pattern SA_MP1. In contrast, as shown in the embodiment of FIG. 29, the thickness W1' of the overlay key area second pattern layer 262 may be substantially the same as the thickness W1' of the chip area second pattern layer 261 in the semiconductor substrate 10 that has been exposed and etched based on the first chip area mask pane CA_MP1 and the second scribe lane area mask pattern SA_MP2. For example, there may be no difference between the thickness of the overlay key area second pattern layer 262 and the thickness of the chip area second pattern layer 261. The overlay key patterns OK may be normally formed in the overlay key area OA or in the scribe lane area SA by the simulation and the feedback process of the mask pattern compensation module 140.

Hereinafter, a semiconductor device manufacturing system 4 according to some other embodiments of the present inventive concepts will be described with reference to FIGS. 32 to 34.

Figure 32:
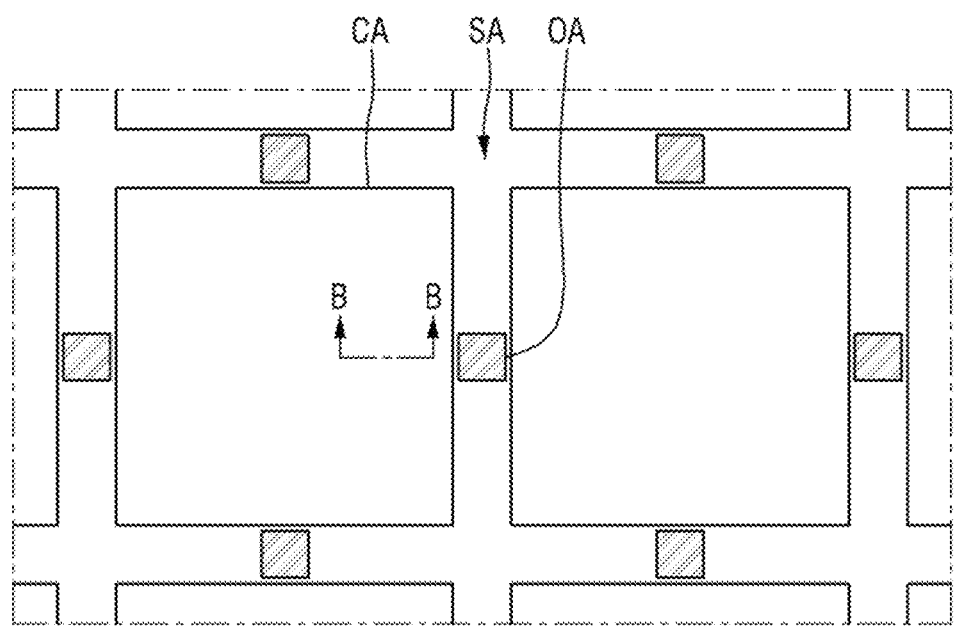
FIG. 32 is a partially enlarged view of a semiconductor substrate according to air embodiment of the present inventive concepts.

FIG. 32 is a partially enlarged view of a semiconductor substrate according to an embodiment of the present inventive concepts. FIG. 33 is a cross-sectional view of the semiconductor substrate taken along line B-B of FIG. 32. FIG. 34 is a block diagram of a semiconductor device manufacturing system according to an embodiment of the present inventive concepts. For simplicity of description, a repeated description of substantially similar elements described with respect to the embodiments of FIGS. 1 to 31 will be omitted for convenience of explanation.

Referring to the embodiment of FIG. 32, a semiconductor substrate 10 may include a chip area CA, a scribe lane area SA, and the like. An overlay key area OA may be included in the scribe lane area SA.

Figure 33:
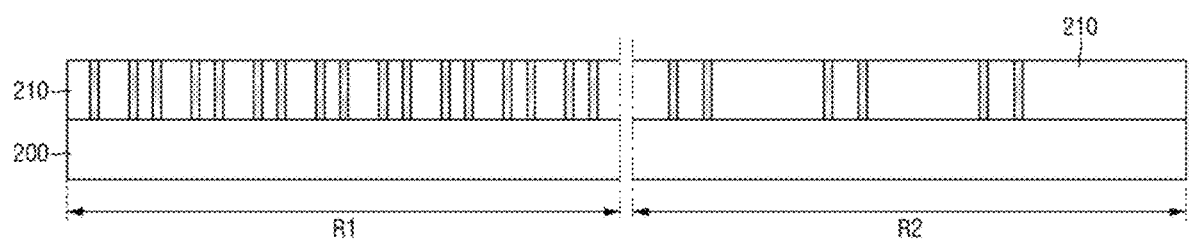
FIG. 33 is a cross-sectional view of the semiconductor substrate taken along line B-B of FIG. 32 according to an embodiment of the present inventive concepts.

Referring to the embodiment of FIG. 33, the chip area CA may include a first region R1 and a second region R2. However, embodiments of the present inventive concepts are not limited thereto. For example, in an embodiment, the scribe lane area SA may also include a first region R1 and a second region R2.

The density of patterns formed in the first region R1 having a fixed area may be greater than the density of patterns formed in the second region R2 having the same fixed area. Accordingly, the semiconductor substrate 10 in the second region R2 may not be etched during a SADP process.

Figure 34:
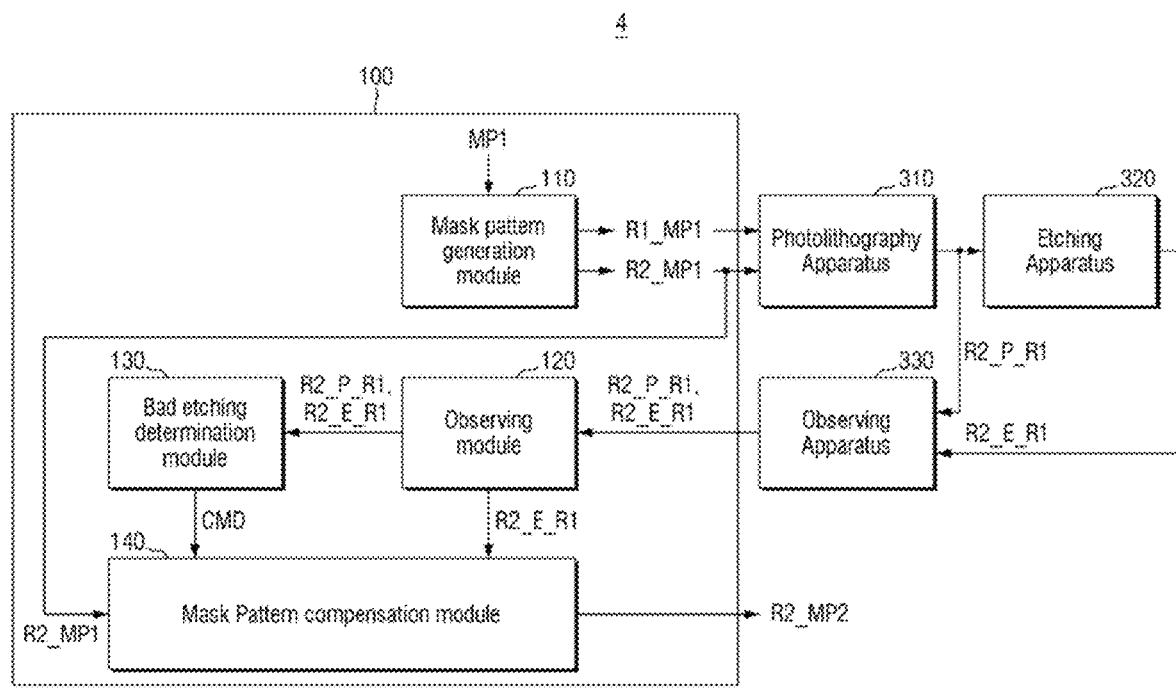
FIG. 34 is a block diagram of a semiconductor device manufacturing system according to an embodiment of the present inventive concepts.

Referring to the embodiment of FIG. 34, the mask pattern generation module 110 may provide a first region mask pattern R1_MP1 and a second region mask pattern R2_MP1 to the photolithography apparatus 310. The photolithography apparatus 310 and the etching apparatus 320 may perform processes on the first region R1 and the second region R2 of the semiconductor substrate 10 based on the first region mask pattern R1_MP1 and the second region mask pattern R2_MP1, respectively.

The observing apparatus 330 may transfer a second region exposure result R2_P_R1 and a second region etching result R2_E_R1 to the observing module 120. The bad etching determination module 130 may provide a command CMD to the mask pattern compensation module 140 in response to the second region exposure result R2_P_R1 and the second region etching result R2_E_R1.

The mask pattern compensation module 140 may generate a second region mask pattern R2_MP2 based on the command CMD, the second region mask pattern R2_MP1, and the second region etching result R2_E_R1. The photolithography apparatus 310 and the etching apparatus 320 may perform an exposure process and an etching process on the semiconductor substrate 10 based on the new second region mask pattern R2_MP2. Accordingly the semiconductor substrate 10 may be normally etched. For example, the semiconductor substrate 10 shown in the embodiment of FIG. 33 may be formed.

In concluding the detailed description, those skilled in the art will appreciate that many variations and modifications can be made to the described embodiments without substantially departing from the principles of the present inventive concepts. Therefore, the described embodiments of the present inventive concepts are used in a generic and descriptive sense only and not for purposes of limitation.

What is claimed is:

1. A semiconductor device manufacturing system comprising:
    a photolithography apparatus performing exposure on a semiconductor substrate including a chip area and a scribe lane area;
    an etching apparatus etching the semiconductor substrate that has been exposed by the photolithography apparatus;
    an observing apparatus imaging the semiconductor substrate that has been etched by the etching apparatus; and
    a controller controlling the photolithography apparatus and the etching apparatus,
    wherein the controller generates a first mask pattern and provides the first mask pattern to the photolithography apparatus,
    the photolithography apparatus performs exposure on the semiconductor substrate using the first mask pattern to provide an exposed semiconductor substrate,
    the etching apparatus performs etching on the exposed semiconductor substrate to provide an etched semiconductor substrate,
    the observing apparatus generates a first semiconductor substrate image by imaging the etched semiconductor substrate corresponding to the scribe lane area and a second semiconductor substrate image by imaging the exposed semiconductor substrate corresponding to the scribe lane area, wherein the second semiconductor substrate image is generated prior to any etching of the semiconductor substrate by the etching apparatus, and
    the controller generates a second mask pattern based on the first mask pattern and the first semiconductor substrate image, and provides the second mask pattern to the photolithography apparatus,
    wherein the controller comprises a comparator comparing the first and second semiconductor substrate images, and
    wherein the controller determines whether to generate the second mask pattern based on a result compared by the comparator.

2. The semiconductor device manufacturing system of claim 1, wherein the scribe lane area surrounds the chip area and defines the chip area.

3. The semiconductor device manufacturing system of claim 2, wherein the scribe lane area includes an overlay key area having an overlay key formed therein.

4. The semiconductor device manufacturing system of claim 3, wherein the overlay key formed on the scribe lane area is formed based on the first mask pattern.

5. The semiconductor device manufacturing system of claim 1, wherein:
    the controller includes an intensity map generation module and a simulation module;
    the intensity map generation module receives the first mask pattern; and
    the comparator receives the first semiconductor substrate image.

6. The semiconductor device manufacturing system of claim 5, wherein:
    the intensity map generation module generates an intensity map for the first mask pattern using the first mask pattern and exposure data; and
    the intensity map generation module provides the generated intensity map and the exposure data to the comparator.

7. The semiconductor device manufacturing system of claim 6, wherein the exposure data includes a wavelength of incident light and a numerical aperture.

8. The semiconductor device manufacturing system of claim 6, wherein:
    the comparator compares the first semiconductor substrate image with the intensity map; and
    when the first semiconductor substrate image corresponds to the intensity map, the comparator provides the exposure data to the simulation module.

9. The semiconductor device manufacturing system of claim 8, wherein the simulation module generates the second mask pattern by correcting the first mask pattern based on correction data and the exposure data.

10. The semiconductor device manufacturing system of claim 9, wherein the correction data includes a dummy mask pattern for a dummy pattern formed on the scribe lane area.

11. The semiconductor device manufacturing system of claim 1, wherein the photolithography apparatus and the etching apparatus perform a self-aligned double patterning (SADP) process on the semiconductor substrate using the first mask pattern.

12. A semiconductor device manufacturing system comprising:
    a photolithography apparatus performing exposure on a semiconductor substrate including a first region and a second region;
    an etching apparatus etching the semiconductor substrate that has been exposed by the photolithography apparatus; and
    a controller controlling the photolithography apparatus and the etching apparatus,
    wherein the controller generates a first mask pattern for the first region and a second mask pattern for the second region, and provides the first and second mask patterns to the photolithography apparatus,
    an arrangement density of the second mask pattern is less than an arrangement density of the first mask pattern,
    the photolithography apparatus performs exposure on the first and second regions of the semiconductor substrate using the first and second mask patterns, respectively, to provide an exposed semiconductor substrate,
    the etching apparatus performs etching on the exposed semiconductor substrate,
    the controller generates a third mask pattern based on the second mask pattern and an image of the second region of the semiconductor substrate that has been etched by the etching apparatus, and provides the third mask pattern to the photolithography apparatus,
    wherein the controller comprises a comparator comparing an image of the second region of the exposed semiconductor substrate with an image of the second region of an etched semiconductor substrate that has been etched by the etching apparatus, wherein the controller determines whether to generate the third mask pattern based on a result by the comparator, wherein the image of the second region of the exposed semiconductor substrate is generated prior to any etching of the semiconductor substrate by the etching apparatus.

13. The semiconductor device manufacturing system of claim 12, wherein the photolithography apparatus and the etching apparatus perform a self-aligned double patterning (SADP) process on the semiconductor substrate using the first and second mask patterns.

14. The semiconductor device manufacturing system of claim 12, wherein:

the semiconductor substrate includes a chip area and a scribe lane area; and the chip area includes the first and second regions.

15. A semiconductor device manufacturing system comprising:

a photolithography apparatus performing exposure on a semiconductor substrate including a chip area and a scribe lane area;

an etching apparatus performing etching on the semiconductor substrate;

a deposition apparatus performing deposition on the substrate; and a controller controlling the photolithography apparatus and the etching apparatus, wherein the controller generates a first mask pattern and provides the first mask pattern to the photolithography apparatus, the photolithography apparatus and the etching apparatus form a first pattern on the chip area of the substrate using the first mask pattern, and form a second pattern on the scribe lane area of the substrate, the deposition apparatus forms a first spacer layer on the first pattern, forms a second spacer layer on the second pattern, forms a first mask layer on the first spacer layer, and forms a second mask layer on the second spacer layer, the etching apparatus forms a third pattern by etching the first mask layer and the first spacer layer, and forms a fourth pattern by etching the second mask layer and the second spacer layer, the etching apparatus etches the substrate on the scribe lane area using the fourth pattern, the controller comprises a comparator comparing a first substrate image of the exposed substrate on the scribe lane area with a second substrate image of the etched substrate on the scribe lane area, the controller generates a second mask pattern based on the first substrate image of the exposed substrate on the scribe lane area using the first mask pattern and the second substrate image of the etched substrate on the scribe lane area using the fourth pattern, and provides the second mask pattern to the photolithography apparatus, wherein the first substrate image of the exposed substrate is generated prior to any etching of the semiconductor substrate by the etching apparatus.

16. The semiconductor device manufacturing system of claim 15, wherein a thickness of the first mask layer is substantially equal to a thickness of the second mask layer.

17. The semiconductor device manufacturing system of claim 15, wherein the second mask pattern generated by the controller includes the first mask pattern and a first dummy mask pattern surrounding the first mask pattern.

18. The semiconductor device manufacturing system of claim 17, wherein the second mask pattern generated by the controller includes a second dummy mask pattern overlapping the first mask pattern.

\* \* \* \* \*